United States Patent
Yilmaz et al.

(10) Patent No.: US 10,186,573 B2
(45) Date of Patent: Jan. 22, 2019

(54) LATERAL POWER MOSFET WITH NON-HORIZONTAL RESURF STRUCTURE

(71) Applicant: MaxPower Semiconductor, Inc., San Jose, CA (US)

(72) Inventors: Hamza Yilmaz, San Jose, CA (US); Mohamed N. Darwish, Campbell, CA (US); Richard A. Blanchard, Los Altos, CA (US)

(73) Assignee: MaxPower Semiconductor, Inc., San Jose, CA (US)

( * ) Notice: Subject to any disclaimer, the term of this patent is extended or adjusted under 35 U.S.C. 154(b) by 14 days.

(21) Appl. No.: 15/202,227

(22) Filed: Jul. 5, 2016

(65) Prior Publication Data

US 2017/0077221 A1  Mar. 16, 2017

Related U.S. Application Data

(60) Provisional application No. 62/218,114, filed on Sep. 14, 2015.

(51) Int. Cl.
*H01L 29/06* (2006.01)
*H01L 29/10* (2006.01)
(Continued)

(52) U.S. Cl.
CPC ........ *H01L 29/0634* (2013.01); *H01L 27/067* (2013.01); *H01L 29/0692* (2013.01);
(Continued)

(58) Field of Classification Search
CPC ............... H01L 29/0634; H01L 29/063; H01L 29/1095; H01L 29/7816; H01L 27/0248;
(Continued)

(56) References Cited

U.S. PATENT DOCUMENTS

| | | | | |
|---|---|---|---|---|
| 4,754,310 A | * | 6/1988 | Coe | ...................... H01L 29/0634 257/287 |
| 5,237,193 A | * | 8/1993 | Williams | ............ H01L 29/1087 257/336 |

(Continued)

OTHER PUBLICATIONS

Oxford Dictionaries, "substantially", Oxford Dictionaries, Apr. 2010, Oxiford Dictionaries, definition/american_english.*

(Continued)

*Primary Examiner* — Yu Chen
*Assistant Examiner* — Pauline Vu
(74) *Attorney, Agent, or Firm* — Patent Law Group LLP; Brian D. Ogonowsky

(57) ABSTRACT

In one embodiment, a RESURF structure between a source and a drain in a lateral MOSFET is formed in a trench having a flat bottom surface and angled sidewalls toward the source. Alternating P and N-type layers are epitaxially grown in the trench, and their charges balanced to achieve a high breakdown voltage. In the area of the source, the ends of the P and N-layers angle upward to the surface under the lateral gate and contact the body region. Thus, for an N-channel MOSFET, a positive gate voltage above the threshold forms a channel between the source and the N-layers in the RESURF structure as well as creates an inversion of the ends of the P-layers near the surface for low on-resistance. In another embodiment, the RESURF structure is vertically corrugated by being formed around trenches, thus extending the length of the RESURF structure for a higher breakdown voltage.

20 Claims, 27 Drawing Sheets

(51) Int. Cl.
  *H01L 27/02* (2006.01)
  *H01L 27/06* (2006.01)
  *H01L 29/739* (2006.01)
  *H01L 29/78* (2006.01)
  *H01L 29/66* (2006.01)
  *H01L 29/40* (2006.01)
  *H01L 29/417* (2006.01)
  *H01L 29/08* (2006.01)
  *H01L 27/07* (2006.01)

(52) U.S. Cl.
  CPC ...... *H01L 29/0834* (2013.01); *H01L 29/0878* (2013.01); *H01L 29/0886* (2013.01); *H01L 29/1095* (2013.01); *H01L 29/402* (2013.01); *H01L 29/404* (2013.01); *H01L 29/41758* (2013.01); *H01L 29/66659* (2013.01); *H01L 29/66681* (2013.01); *H01L 29/66689* (2013.01); *H01L 29/66696* (2013.01); *H01L 29/7393* (2013.01); *H01L 29/7816* (2013.01); *H01L 29/7818* (2013.01); *H01L 29/7835* (2013.01); *H01L 27/0727* (2013.01)

(58) Field of Classification Search
  CPC .............. H01L 27/0629; H01L 27/067; H01L 29/7393; H01L 29/66659; H01L 29/7835; H01L 29/66681; H01L 29/66689; H01L 29/66696; H01L 29/66704; H01L 29/7824; H01L 29/7825
  See application file for complete search history.

(56) References Cited

U.S. PATENT DOCUMENTS

| | | | | |
|---|---|---|---|---|
| 5,264,719 A * | 11/1993 | Beasom | ............... | H01L 29/063 257/335 |
| 5,378,920 A * | 1/1995 | Nakagawa | ............... | H01L 21/74 257/487 |
| 5,539,238 A * | 7/1996 | Malhi | ............... | H01L 29/0615 257/335 |
| 6,097,063 A * | 8/2000 | Fujihira | ............... | H01L 29/0619 257/139 |
| 6,465,869 B2 * | 10/2002 | Ahlers | ............... | H01L 29/0634 257/332 |
| 6,835,993 B2 * | 12/2004 | Sridevan | ............... | H01L 29/0634 257/330 |
| 6,878,997 B2 * | 4/2005 | Pfirsch | ............... | H01L 29/0634 257/262 |
| 6,909,143 B2 * | 6/2005 | Jeon | ............... | H01L 29/0634 257/335 |
| 7,253,477 B2 * | 8/2007 | Loechelt | ............... | H01L 29/0634 257/328 |
| 7,759,696 B2 * | 7/2010 | Kaneko | ............... | H01L 29/063 257/141 |
| 8,564,057 B1 * | 10/2013 | Darwish | ............... | H03K 17/04106 257/334 |
| 8,878,295 B2 * | 11/2014 | Hopper | ............... | H01L 29/41766 257/328 |
| 9,312,381 B1 * | 4/2016 | Bobde | ............... | H01L 29/7823 |
| 2002/0060330 A1 * | 5/2002 | Onishi | ............... | H01L 29/0634 257/262 |
| 2002/0119611 A1 * | 8/2002 | Disney | ............... | H01L 29/7825 438/197 |
| 2003/0047776 A1 | 3/2003 | Hueting et al. | | |
| 2003/0127687 A1 * | 7/2003 | Kumagai | ............... | H01L 27/0255 257/335 |
| 2004/0065934 A1 | 4/2004 | Sridevan et al. | | |
| 2004/0108551 A1 * | 6/2004 | Kitamura | ............... | H01L 29/0653 257/342 |
| 2005/0218431 A1 * | 10/2005 | Nair | ............... | H01L 29/0634 257/262 |
| 2006/0261408 A1 * | 11/2006 | Khemka | ............... | H01L 29/8611 257/335 |
| 2006/0284276 A1 * | 12/2006 | Yilmaz | ............... | H01L 29/0634 257/492 |
| 2007/0023827 A1 * | 2/2007 | Tu | ............... | H01L 29/0634 257/330 |
| 2007/0176244 A1 * | 8/2007 | Yoshikawa | ............... | H01L 29/0615 257/401 |
| 2008/0001198 A1 * | 1/2008 | Jeon | ............... | H01L 29/0634 257/298 |
| 2008/0029814 A1 * | 2/2008 | Khalil | ............... | H01L 29/0634 257/339 |
| 2008/0128744 A1 * | 6/2008 | Cai | ............... | H01L 29/0634 257/147 |
| 2008/0197445 A1 * | 8/2008 | Disney | ............... | H01L 21/76264 257/506 |
| 2008/0211020 A1 * | 9/2008 | Saito | ............... | H01L 29/0634 257/342 |
| 2008/0261358 A1 * | 10/2008 | Sonsky | ............... | H01L 21/3247 438/197 |
| 2009/0166728 A1 * | 7/2009 | Pan | ............... | H01L 29/0623 257/330 |
| 2009/0236697 A1 * | 9/2009 | Ono | ............... | H01L 29/0634 257/618 |
| 2010/0123171 A1 * | 5/2010 | Yang | ............... | H01L 27/0733 257/272 |
| 2010/0156506 A1 * | 6/2010 | Tsuzuki | ............... | H01L 27/0664 327/478 |
| 2010/0308370 A1 * | 12/2010 | Hshieh | ............... | H01L 29/0619 257/136 |
| 2011/0014760 A1 | 1/2011 | Jeon et al. | | |
| 2011/0127606 A1 * | 6/2011 | Bobde | ............... | H01L 27/0705 257/337 |
| 2012/0175679 A1 * | 7/2012 | Marino | ............... | H01L 29/402 257/194 |
| 2013/0015493 A1 * | 1/2013 | Senoo | ............... | H01L 29/7395 257/133 |
| 2013/0264607 A1 | 10/2013 | Werber et al. | | |

OTHER PUBLICATIONS

PCT/US16/50245 USPTO as ISA, International Search Report and Written Opinion, dated Jan. 19, 2017, 14 pages.

* cited by examiner

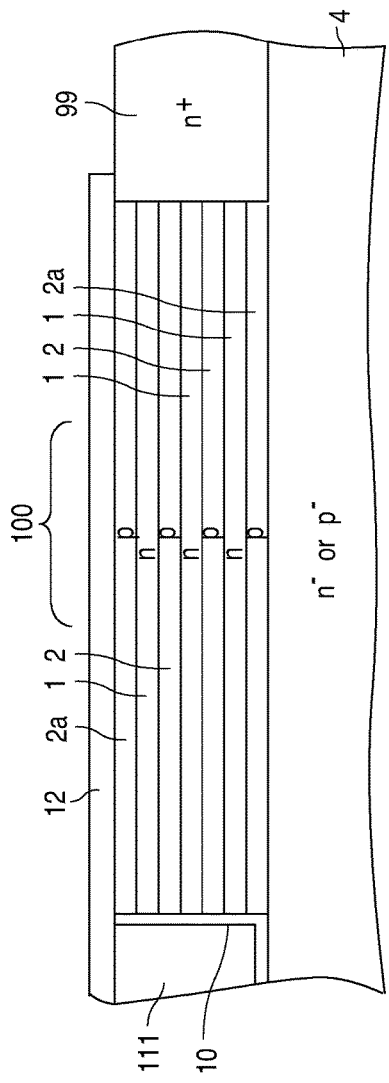
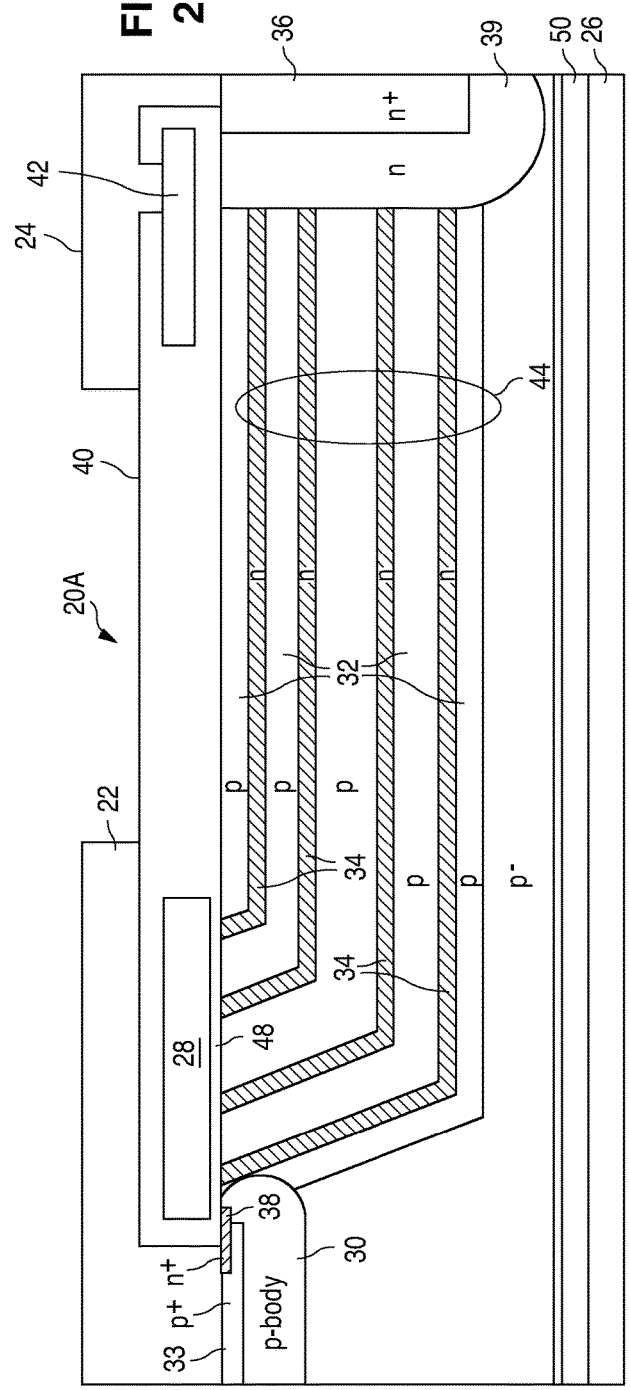

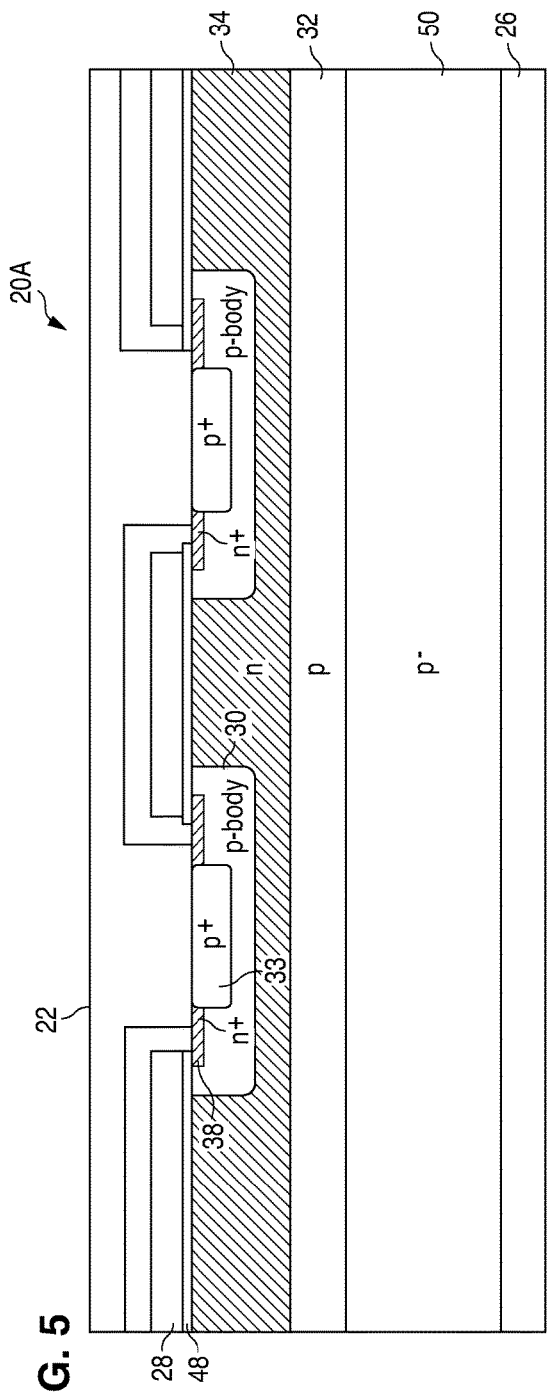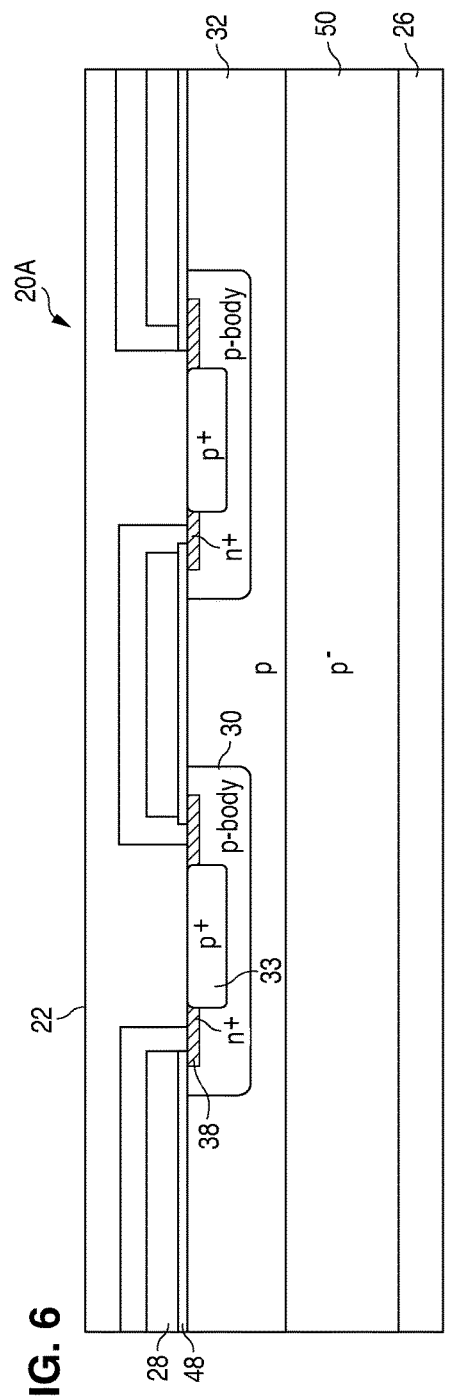

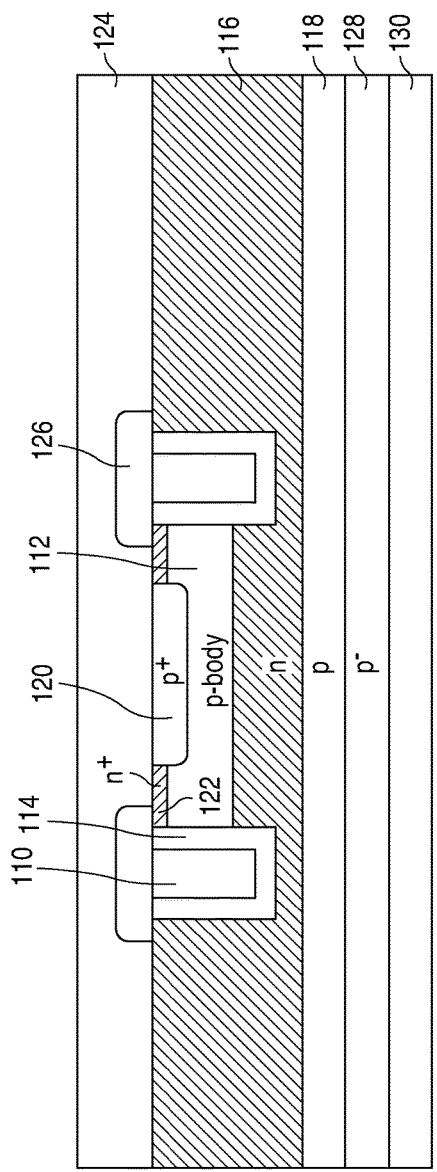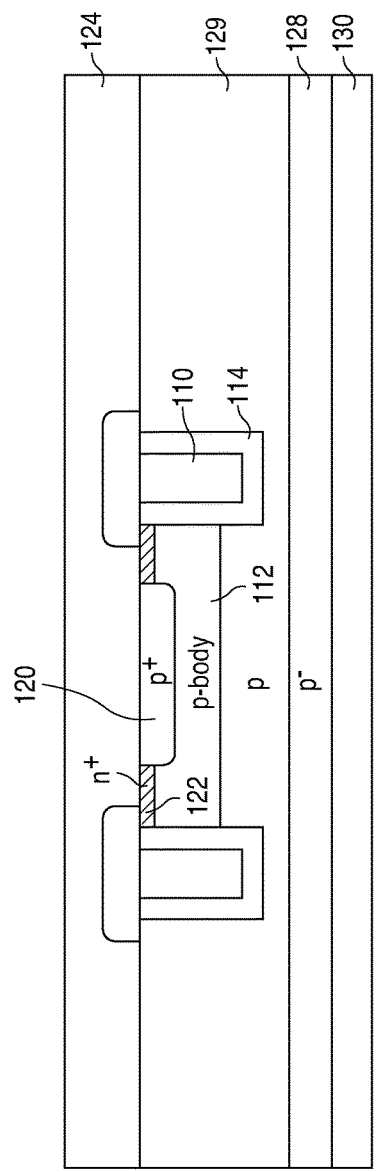
FIG. 29
FIG. 30

LATERAL POWER MOSFET WITH NON-HORIZONTAL RESURF STRUCTURE

CROSS REFERENCE TO RELATED APPLICATIONS

This application claims priority from U.S. provisional application Ser. No. 62/218,114, filed Sep. 14, 2015, by Hamza Yilmaz et al., assigned to the present assignee and incorporated herein by reference.

FIELD OF INVENTION

The present invention relates to lateral power semiconductor devices and, in particular, to a lateral MOSFET having a particular RESURF design.

BACKGROUND

High power lateral MOSFETs typically have a relatively low dopant concentration drift region, of the same conductivity type as the drain, leading from the drain to the channel region. When the MOSFET is off, the drift region depletes somewhat to achieve a desired breakdown voltage. Higher breakdown voltages are achieved with longer drift regions, given a certain dopant concentration in the drift region. The low doping level of the drift regions adds significant on-resistance. Further, when the MOSFET is off, the electric field is concentrated near the PN junction at the surface of the drift region under the gate, which limits the breakdown voltage.

A RESURF (Reduced Surface Field) structure is sometimes used to increase the breakdown voltage of a MOSFET and/or reduce the on-resistance and replaces the conventional drift region with alternating thin layers of P and N-type material. When the MOSFET is off, the P and N-type layers become entirely depleted more evenly along their length so the electric field is not concentrated near the channel region. This behavior results in a higher breakdown voltage and enables higher doping levels to be used in the RESURF layers which reduce on-resistance.

FIG. 1 is a reproduction of a figure from U.S. Pat. No. 6,097,063, showing a cross-sectional view of a RESURF structure in a lateral MOSFET with a deep trenched gate. To turn the MOSFET on, a sufficiently positive voltage is applied to the trenched gate 111 to invert a deep P-body region (not shown in the cross-section but vertically adjacent the gate 111) to conduct current between an N+ source (not shown) and the N+ drain 99. Layer 10 is a gate oxide. The alternating P and N layers 1, 2, and 2a are the RESURF layers 100, and the N-layers 1 conduct the current. The substrate 4 can be either N- or P-type. The top layer 12 is a dielectric film.

Forming deep P-body/channel regions and trenched gates adds to the structure complexity and results in a MOSFET with a threshold voltage that is difficult to control. Furthermore, connecting the P layers in the RESURF structure at the source side to the source electrode (via the P-body region) without limiting the current flow is difficult.

What is needed is an improved device structure for a RESURF lateral MOSFET, where a relatively shallow P-body channel region is inverted using a gate located close to the surface and where the P layers in the RESURF structure are easily connected to the P-body region.

What is also desirable is an improved design for a RESURF structure in a lateral MOSFET that exhibits an effectively long drift region (for high breakdown voltage) without directly increasing the top surface area of the RESURF structure.

SUMMARY

In a high voltage or medium voltage lateral MOSFET, a RESURF structure is used for achieving a higher breakdown voltage and/or lower on-resistance. The RESURF structure comprises alternating P and N-type layers between the channel region and the drain.

The P and N-type layers of the RESURF structure run horizontally from the drain and then angle upward toward the surface under the lateral gate. In one embodiment, all the RESURF layers terminate at a P-body region in one area of the MOSFET. In another area of the MOSFET, portions of the P-type layers under the lateral gate are inverted by the gate and form a conductive channel between the N+ source region and the N-type layers of the RESURF structure.

Thus, a trenched gate and/or deep body is not required.

A novel process for forming the lateral MOSFET is also described. In a starting substrate, the area for the RESURF structure is etched away. Thin layers of the alternating P and N-type layers are then epitaxially grown within the trench. Other features of the MOSFET are then formed.

An IGBT structure is also described where the drain is replaced by a collector region having the same conductivity type as the body region.

Other embodiments are described.

BRIEF DESCRIPTION OF THE DRAWINGS

FIG. 1 is a cross-sectional view of a prior art lateral MOSFET with a RESURF structure from U.S. Pat. No. 6,097,063.

FIGS. 2A, 2B, and 2C are alternative cross-sectional views of a portion of a lateral MOSFET in accordance with several embodiments of the invention cut along line Y1-Y2 in FIG. 3.

FIG. 5 illustrates the MOSFET cut along line X1-X2 in FIG. 3.

FIG. 6 illustrates the MOSFET cut along line X3-X4 in FIG. 3.

FIG. 7 is a top down view of a small portion of the starting P-type substrate for a single cell, showing a patterned mask layer.

FIG. 8 is a cross-sectional view of the substrate of FIG. 7 after a trench is formed in it, with one end of the trench (under the gate) having an angled sidewall. The other end of the trench may also have an angled sidewall, depending on whether the drain is shallow or deep.

FIG. 9 illustrates alternating P and N-type layers epitaxially grown in the trench and over the surface of the substrate.

FIG. 10 illustrates the P and N-type layers removed from the top surface of the substrate using Chemical Mechanical Polishing (CMP), leaving only the layers in the trench to form a RESURF structure, with a oxide layer deposited and/or grown over the horizontal area of the RESURF structure. The P and N-type layers are angled upward to the top surface on the left side (the channel side).

FIG. 11 is a top down view of the structure of FIG. 10 but expanded to the right to show an area of an additional cell.

FIG. 12 illustrates a gate oxide and lateral gate formed over the area of the P and N-type layers in the RESURF structure that angle up to the surface.

FIG. 13 is a top down view showing two adjacent cells, where the left cell is a top view of the structure of FIG. 12.

FIG. 14 illustrates the structure after a polysilicon gate layer is defined and a diffused N+ source and P-body are formed extending under the gate and a thick oxide layer is formed over the surface.

FIG. 15 is a top view of a larger portion of the MOSFET structure showing two cells prior to the source and drain metal being formed.

FIG. 16 illustrates the structure cut along line Y1-Y2 in FIG. 15 after the formation of the source and drain metals, a backside metal layer (connected to the source potential), and a passivation layer.

FIG. 17 illustrates the structure cut along line Y3-Y4 in FIG. 15 after the formation of the source and drain metals, the backside metal layer, and the passivation layer.

FIG. 18 is a top view of the entire completed MOSFET showing a much wider view, where the corrugated configuration along the gate/channel shown in FIG. 15 is too small to see. The drain regions are interdigitated with the source regions to greatly increase the effective width of the gate for increased current handling and reduced on-time.

FIGS. 28-30 illustrate another embodiment of a lateral MOSFET using a shallow trenched gate along with a RESURF structure, where the RESURF structure is similar to that of the other embodiments where the alternating P and N-type layers have a horizontal portion and a portion that is angled upwards to terminate at the surface, and where the trenched gate cuts into the portion of the RESURF structure that is angled upwards.

FIG. 28 is a top down view of a MOSFET cell showing a trenched gate and a RESURF structure that is angled upwards near the gate so that the ends of the RESURF layers are exposed at the surface.

FIG. 29 illustrates the structure of FIG. 28 cut along line X1-X2 of FIG. 28.

FIG. 30 illustrates the structure of FIG. 28 cut along line X3-X4 of FIG. 28.

FIG. 31 illustrates a substrate with non-gate trenches formed in it.

FIG. 32 illustrates P and N-type layers epitaxially grown within the trenches and over the top surface of the substrate to form a vertically corrugated RESURF structure. The open areas of the RESURF structure within the trenches are filled with oxide and an optional floating poly-Si filler to prevent cracking of the oxide.

FIG. 33 is a top down view of a larger portion of the MOSFET of FIG. 32, without the poly-Si fillers, after the N+ source and N+ drain are formed.

FIG. 34 illustrates the MOSFET of FIG. 33 cut along line Y1-Y2.

FIG. 35 illustrates the MOSFET of FIG. 33 cut along line Y3-Y4.

Elements that are identical or similar in the various figures are identified with the same numeral.

DETAILED DESCRIPTION

Figure 2B:
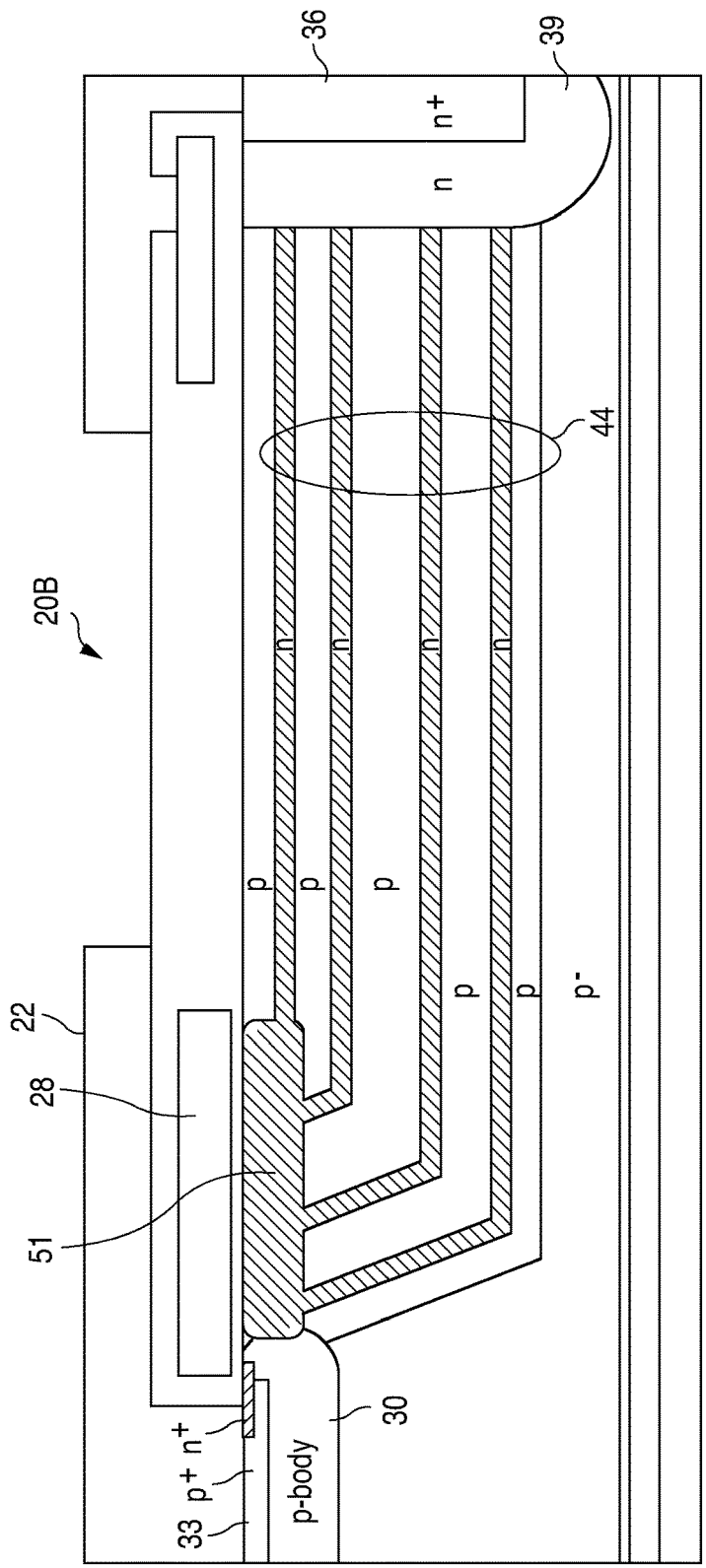
Figure 3:
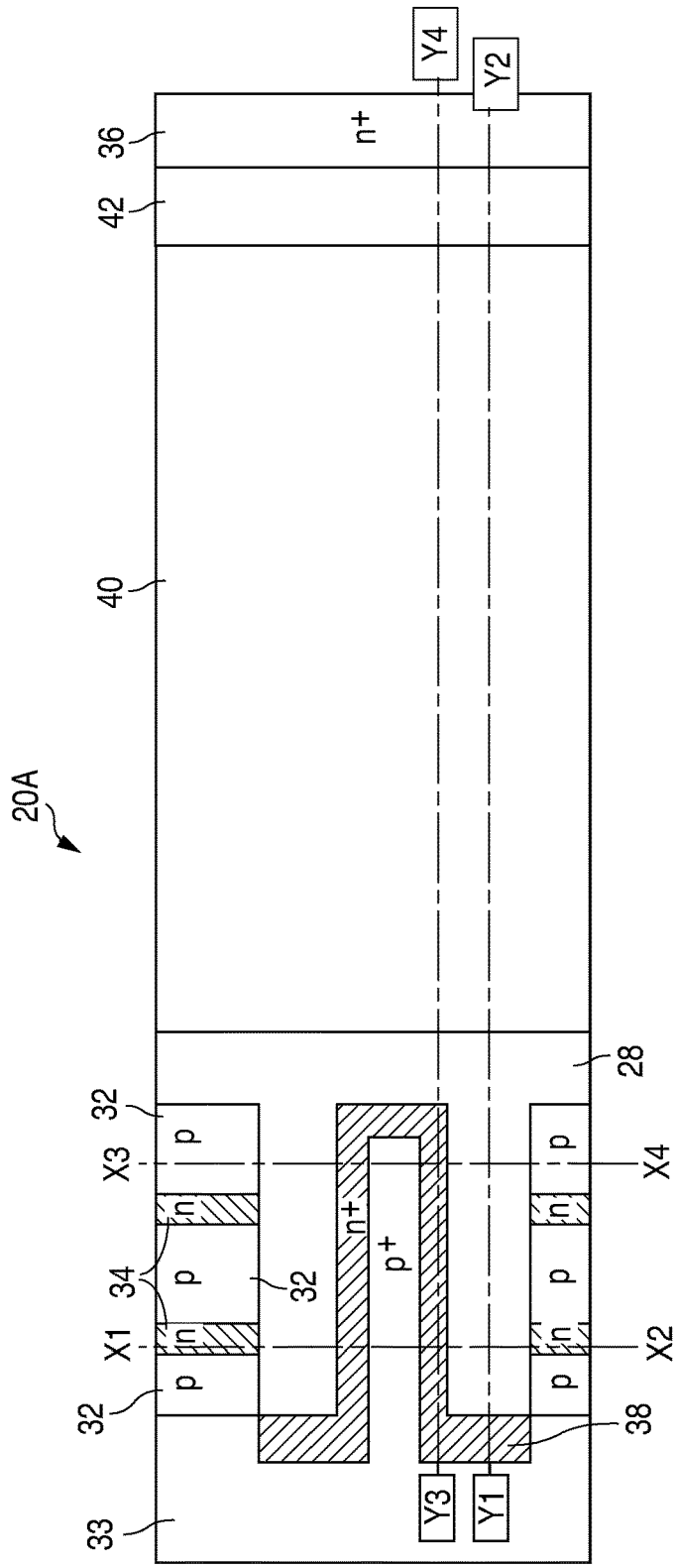
FIG. 3 is a top down view of the MOSFET of FIG. 2A, which is one cell in an array of identical MOSFET cells.

FIG. 2A is a cross-sectional view of a portion of a lateral N-channel MOSFET 20A in accordance with one embodiment of the invention cut along line Y1-Y2 in FIG. 3.

FIG. 2B is an alternative cross-sectional view of a portion of a lateral N-channel MOSFET 20B in accordance with another embodiment of the invention cut along line Y1-Y2 in FIG. 3.

Figure 2C:
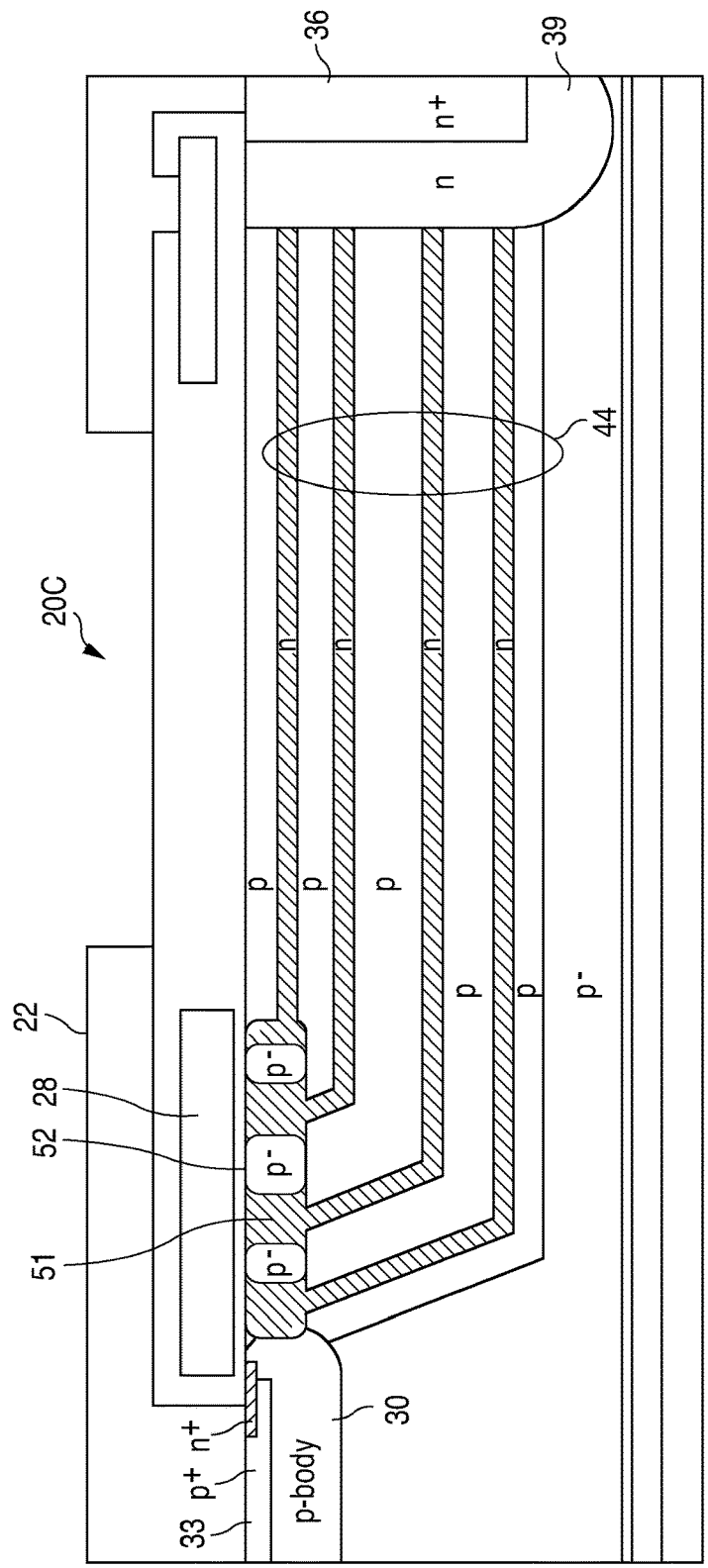

FIG. 2C is an alternative cross-sectional view of a portion of a lateral N-channel MOSFET 20C in accordance with another embodiment of the invention cut along line Y1-Y2 in FIG. 3.

FIG. 3 is a top down view of the MOSFET 20A of FIG. 2A, which is one cell in an array of identical MOSFET cells. The source and drain metals are not shown in FIG. 3, and fewer RESURF layers are shown for simplicity. Further, the polysilicon gate material may extend over all the RESURF layers that are shown exposed at the top surface of the structure of FIG. 2A.

As an overview of the example of FIG. 2A, a top source metal 22, formed on the top surface, is connected to one terminal of a load (not shown), and another terminal of the load is connected to ground. A positive voltage is applied to a top drain metal 24. A backside metal layer 26 is connected to the source potential. When a sufficiently positive gate voltage is coupled to the lateral gate 28, the P-body 30 under the gate 28 is inverted and creates a conductive N-channel. A P+ body contact region 33 couples the source metal 22 to the P-body 30, and the source metal 22 is also coupled to the N+ source 38. Current then flows between the source metal 22 and the drain metal 24 via the N+ source 38, the inverted channel, and the various N-layers 34 (in the RESURF structure).

An optional N-buffer layer 39 couples the various P and N-type layers 32/34 to the N+ drain 36. An oxide layer 40 insulates the source metal 22 and drain metal 24 from the surface and gate 28. A poly-Si field plate 42, connected to the drain metal 24 helps to shield the N-buffer layer 39, forming part of the drain.

The alternating P and N-type layers 32/34 (nine RESURF layers are shown) may be any number and form the RESURF structure 44 that performs a function similar to the RESURF structure of FIG. 1 but has various additional benefits due to its novel construction.

The charges in all of the P and N-type layers of the RESURF structure 44 are ideally balanced to optimize the function of the RESURF structure 44 to increase the breakdown voltage and/or to lower on-resistance. When the MOSFET is off, all or a portion of the RESURF structure 44 is depleted, which spreads the electric field along the depleted portion of the RESURF structure 44. The general operation of a RESURF structure is well-known.

To obviate the need to form the deep trenched gate and deep body region of FIG. 1, all the P and N layers in the RESURF structure 44 run horizontally from the N+ drain 36 until the RESURF layers generally reach under the gate 28 or the P-body 30 near the surface. At that point, the RESURF layers are angled upward until they reach the surface at the gate oxide 48 or reach the P-body 30. The upward angle may even be up to 90 degrees, but the preferred tilt angle is much lower, such as 30-60 degrees, to avoid field crowding.

The upper area of the various P-type layers in the RESURF layers that extend to the gate oxide 48 are inverted by a sufficiently positive gate potential and contain an inversion electrons layer. The P-body 30 under the gate oxide 48 is also inverted. The inverted areas conduct current between the N+ source 38 and the various N-type layers 34 in the RESURF layers 44 so that current flows between the N+ source 38 and the N+ drain 36.

Due to the charge balancing between the P and N-type layers in the RESURF structure 44, the dopant levels of the N-type layers 34 can be made much higher than the dopant level in a conventional N-type drift (non-RESURF) region, thus greatly reducing the on-resistance of the MOSFET. Also, since the various PN junctions in the RESURF structure 44 are generally deeper than a conventional drift region, the depletion is deeper (greater 3D area of charge depletion), causing the electrical field to be more spread out, increasing the breakdown voltage. Further, since the N-type layers 34 in the RESURF structure 44 are more easily depleted due to the charge balancing of the P-type layers 32, their dopant levels can be higher to reduce on-resistance. The various N-type layers 34 are akin to many conductors in parallel, so additional N-type layers 34 can further reduce the on-resistance.

The backside metal layer 26 forms either an ohmic contact or a Schottky contact to the P– substrate 50.

FIG. 2B shows another embodiment of a MOSFET 20B, which is similar to that shown in FIG. 2A but with an additional N-surface layer 51 adjacent to the P-body 30. Due to the disruption of the charge balance of the N and P layers caused by the existence of the P-body 30, the N-surface layer 51 is added to facilitate charge balance. Furthermore, the additional N-surface layer 51 also results in on-resistance reduction due to improved electron current spreading from the inversion channel. The N-surface layer 51 is preferably fully depleted when the MOSFET is in the off state.

FIG. 2C shows another embodiment which is similar to that shown in FIG. 2B but with P-type regions 52 formed in the N-surface layer 51 to facilitate charge balance. This addition may result in an increase in the width of the N layers at the surface while the widths of the P layers are reduced.

Figure 4:
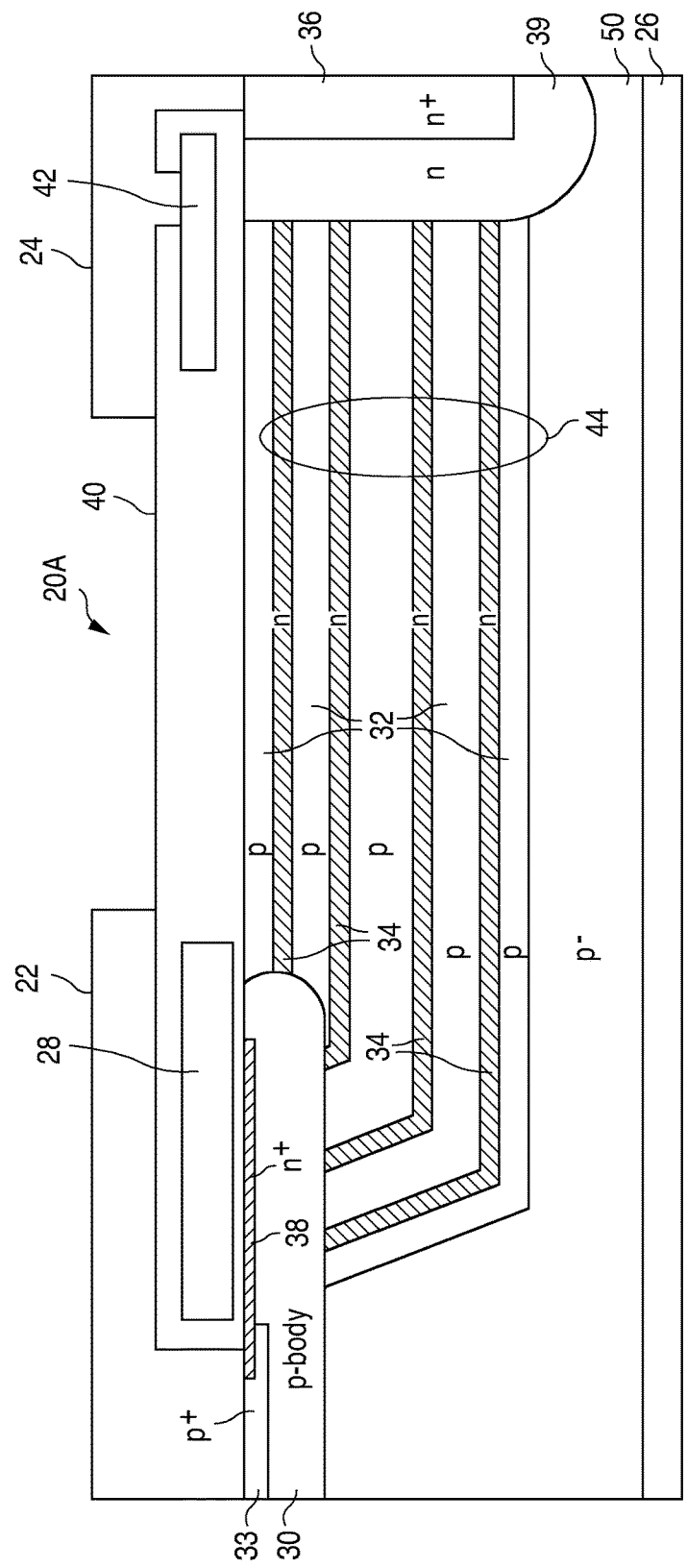
FIG. 4 illustrates the MOSFET cut along line Y3-Y4 in FIG. 3.

FIG. 4 illustrates the MOSFET 20A cut along line Y3-Y4 in FIG. 3.

FIG. 5 illustrates the MOSFET 20A cut along line X1-X2 in FIG. 3 (slicing through multiple layers of the angled portion of the RESURF structure 44) and shows an adjacent gate portion.

FIG. 6 illustrates the MOSFET 20A cut along line X3-X4 in FIG. 3 (slicing though only a single P-type layer 32 in the RESURF structure 44 due the P-type layers 32 being much wider than the N-type layers 34) and shows an adjacent gate portion.

FIGS. 7-18 illustrate a process flow for forming one possible embodiment of the MOSFET 20A of FIGS. 2-6 with four N-type RESURF layers and five P-type RESURF layers. More layers may be used.

Figure 7:
FIGS. 7-18 illustrate a process flow for forming the MOSFET of FIGS. 2-6.

FIG. 7 is a top down view of a small portion of a P-type silicon substrate 50, of <100> orientation, which has a doping of 5e13-5e14 cm$^{-3}$. A SiO$_2$ mask 56 is formed for a subsequent etching step.

Figure 8:
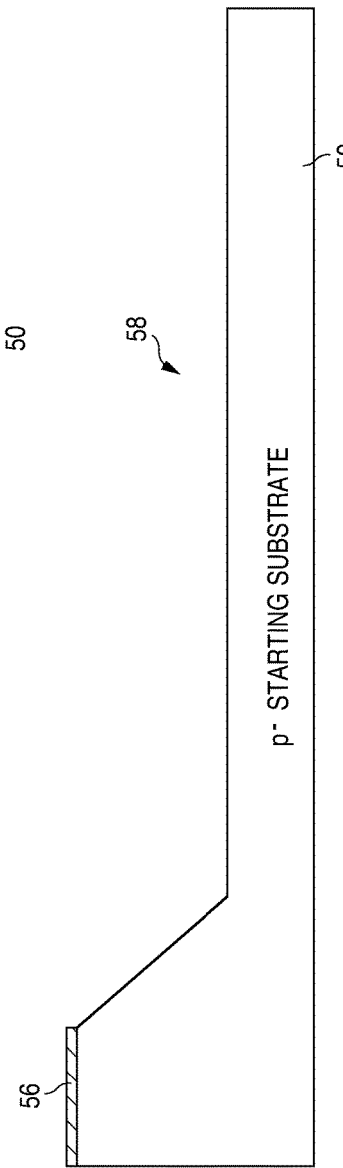

FIG. 8 is a cross-sectional view showing the substrate 50 etched, using Reactive Ion Etching (RIE), to form a 7 micron deep trench 58 with a tilt angle on the source side of about 1-45 degrees. Steeper angles may be used. For a truncated V-shaped trench, the angle may be 54.7 degrees between <100> and <111> crystalline planes by using non-isotropic chemical etchants. FIG. 8 only shows the left side of the trench 58, and the right side of the trench 58 is identical to the left side for two adjacent cells.

Figure 9:
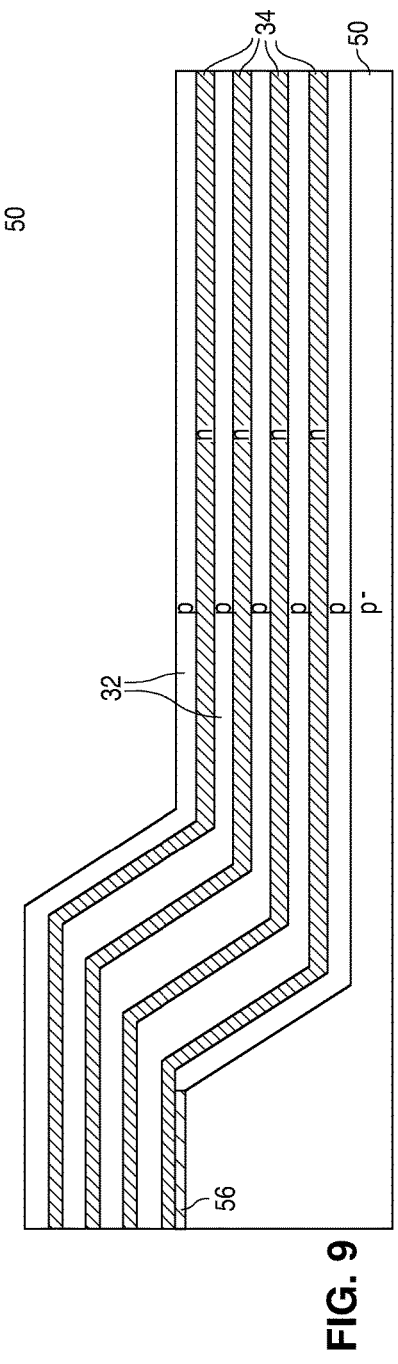

FIG. 9 illustrates the formation of the RESURF layers. In one method, the alternating P-type layers 32 and N-type layers 34 are formed by doping in-situ while the layers are being epitaxially grown. In a second method, N and P-type dopants are implanted periodically for each new layer grown. In a third method, the epitaxial layers are of one conductivity type (N or P) while the implant is of the other conductivity type. The implant doping is about 2e12 cm$^{-2}$, except the first P-layer at the bottom of the RESURF layers and the last P-layer at the top will have only about 1e12 cm$^{-2}$ dose because these two P-layers need to charge balance with half of the adjacent N-layers. Furthermore, the first P-layer at the bottom of the RESURF structure can be adjusted to take into account the effect of the substrate depletion charge on charge balance.

In another method, a first sub-layer of the RESURF structure is grown to about 1-3 microns thick and doped in-situ with P-type doping of 5e13-5e14 cm$^{-3}$. Then, to form a P-type layer 32 within the first sub-layer, the 1-3 micron thick layer is implanted with Boron at a dose of 2e12 cm$^{-2}$ with sufficient energy to dope the bottom half of the 1-3 micron layer. To form an N-type layer 34 over the P-type layer 32, the 1-3 micron thick layer is implanted with Arsenic or Antimony at a dose of about 2e12 cm$^{-2}$ with sufficient energy to dope only the top half of the 1-3 micron layer. This process is then repeated to form subsequent pairs of P and N layers. The layers should be charge balanced for optimal performance. Again, the first P-layer at the bottom of the RESURF layers and the last P-layer at the top will have only about 1e12 cm$^{-2}$ dose because these two P-layers need to charge balance with half of the adjacent N-layers.

The P and N layer thicknesses will be different by design because Boron diffuses faster than Arsenic and Antimony. Therefore, Boron will diffuse across each pair of P and N-layers uniformly after a high temperature process, but Arsenic and Antinomy will diffuse very slowly. After a high temperature process, the thickness of the P-layer 32 will be 2 to 4 times that of the N-layer 34 and have a dopant concentration that is 0.25-0.5 that of the N layer 34. For example, for a 2.5 microns thick pair of P and N-layers, the N-layer will be about 0.5 micron thick and have a dopant concentration of about 4e16 cm$^{-3}$, while the P-layer will be about 2 microns thick and have a 1e16 cm$^{-3}$ dopant concentration. Thus, the charges in the pair of layers balance, since the total charge in each layer is equal but the thickness and volumetric charge densities are different.

The "all epi" approach, with in-situ doping to form the P and N-layers, is preferred for high volume manufacturing, even though the doping concentration control in an epi process is not as good as in an ion implantation process. A single wafer epi reactor with two "connected" chambers can be used to form pairs of the P and N-layers, where the N layers are formed in one chamber and the P-layers are formed in the second chamber without breaking a vacuum.

Note that, in FIG. 9, the P and N-layers 32/34 are also formed over the SiO2 mask 56 (on a mesa). The P and N silicon layers grown over the SiO2 mask 56 will not have a good crystalline structure so will be polysilicon.

Figure 10:
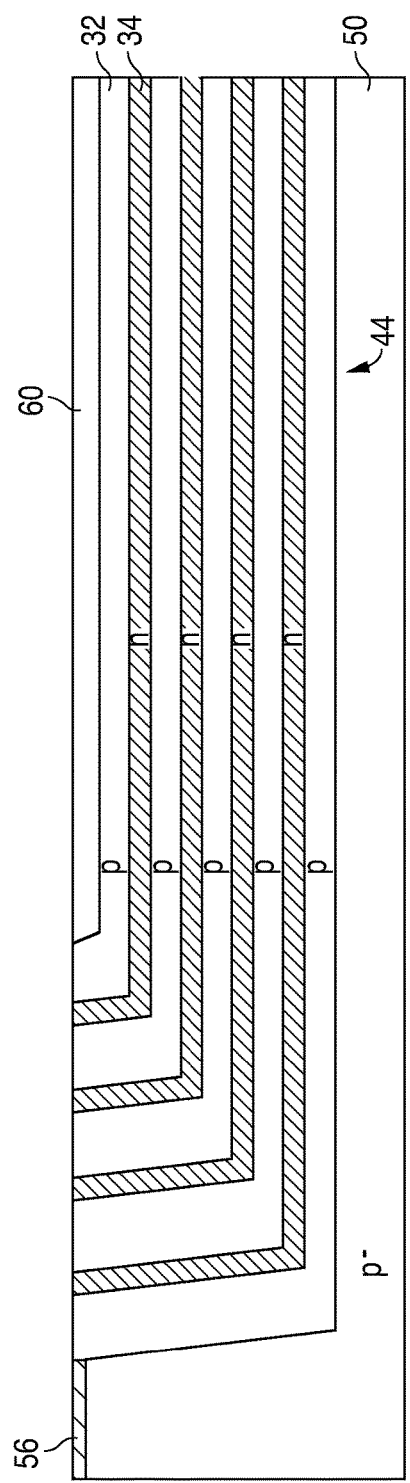

In FIG. 10, the wafer is subjected to a Chemical Mechanical Process (CMP) step to remove the P and N-layers over the mask 56/mesa. During the CMP process step, polysilicon layers grown on top of the mesa surface are removed. A silicon CMP will use the SiO2 mask 56 as an etch stop marker. After the silicon CMP, there will be a 0.5 to 1 micron difference between the top of the horizontal RESURF structure and the mesa surface. This area is filled by oxide 60 and CMPed to make the entire silicon surface coplanar.

Figure 11:

FIG. 11 illustrates the top surface of the structure of FIG. 10 but showing a wider area, where the P and N-layers of the RESURF structure 44 extend to the surface at both ends (for two cells). A drain will eventually be formed along the middle of the RESURF structure 44 for a mirror image type MOSFET.

Figure 12:
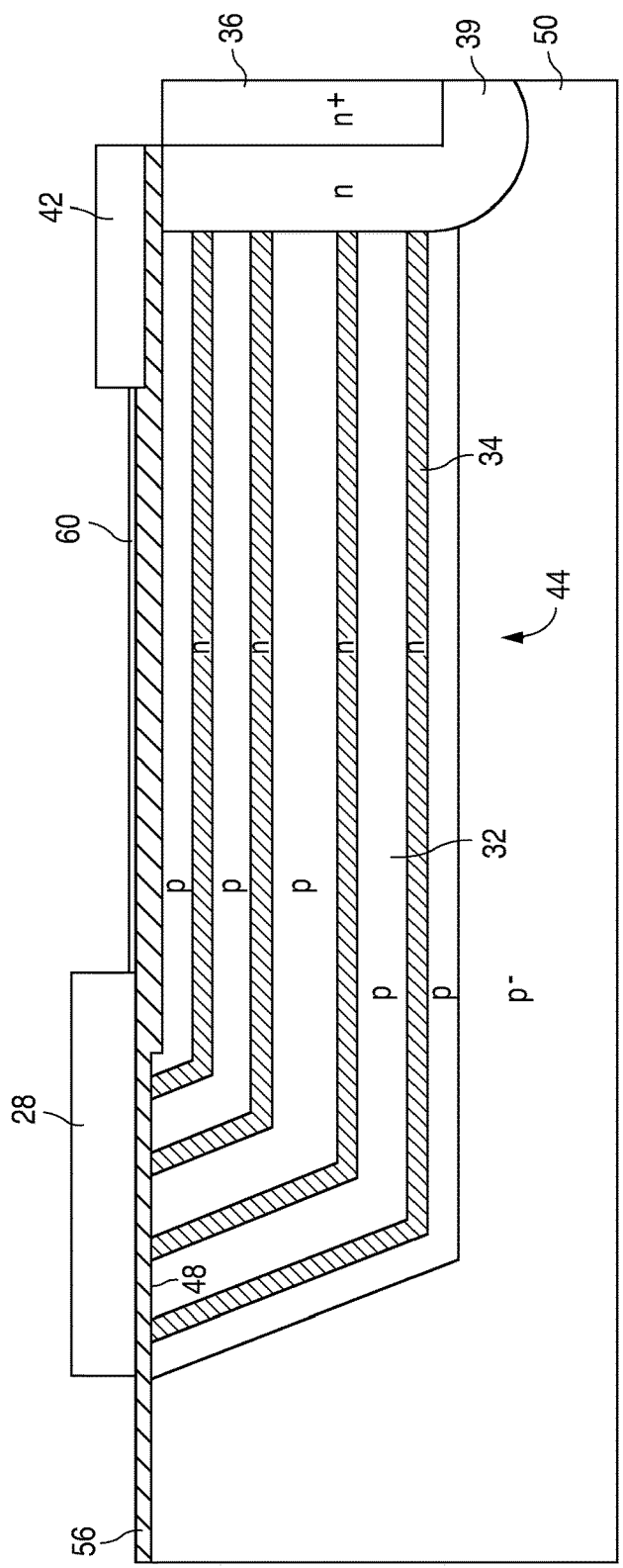

FIG. 12 shows the N+ drain 36 formation by etching a trench though the RESURF structure 44 using a mask and then filling the trench with in-situ doped N-type poly-Si. To form the optional N-buffer region 39, before the trench is filled, phosphorous is implanted with an angle range of 5-15 degrees, depending on trench width and depth. The phosphorous implant dose is in the range of 5e12-5e14 cm$^{-2}$. A heavy phosphorous dose (5e15-1e16 cm$^{-2}$ range) with zero degree is also implanted into the trench bottom to have the phosphorous diffuse laterally and effectively shorten the N layers 34 near the bottom of the trench in the RESURF structure 44.

A thin gate oxide 48 is then grown, followed by the formation of a conductive poly-Si gate 28 and field plate 42.

Figure 13:
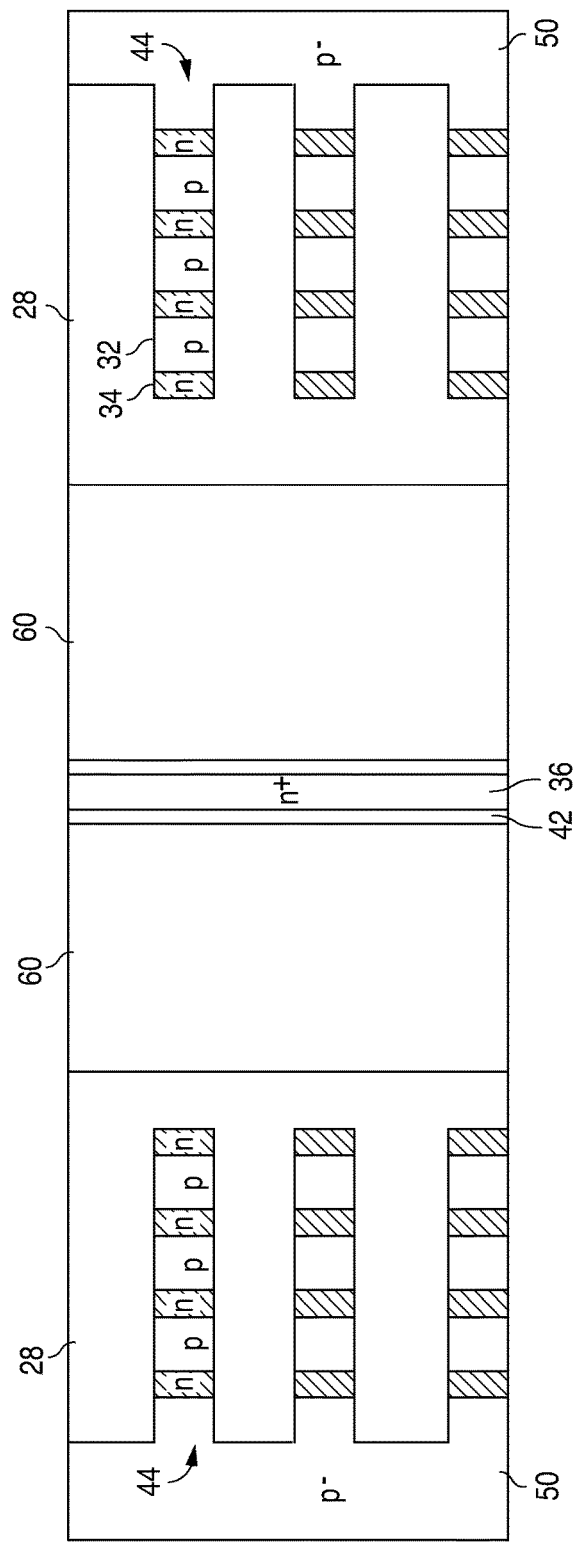

FIG. 13 is a top view of a wider portion of the wafer of FIG. 12. Note that the N+ drain 36 is formed along a center line of the RESURF structure 44.

Figure 14:
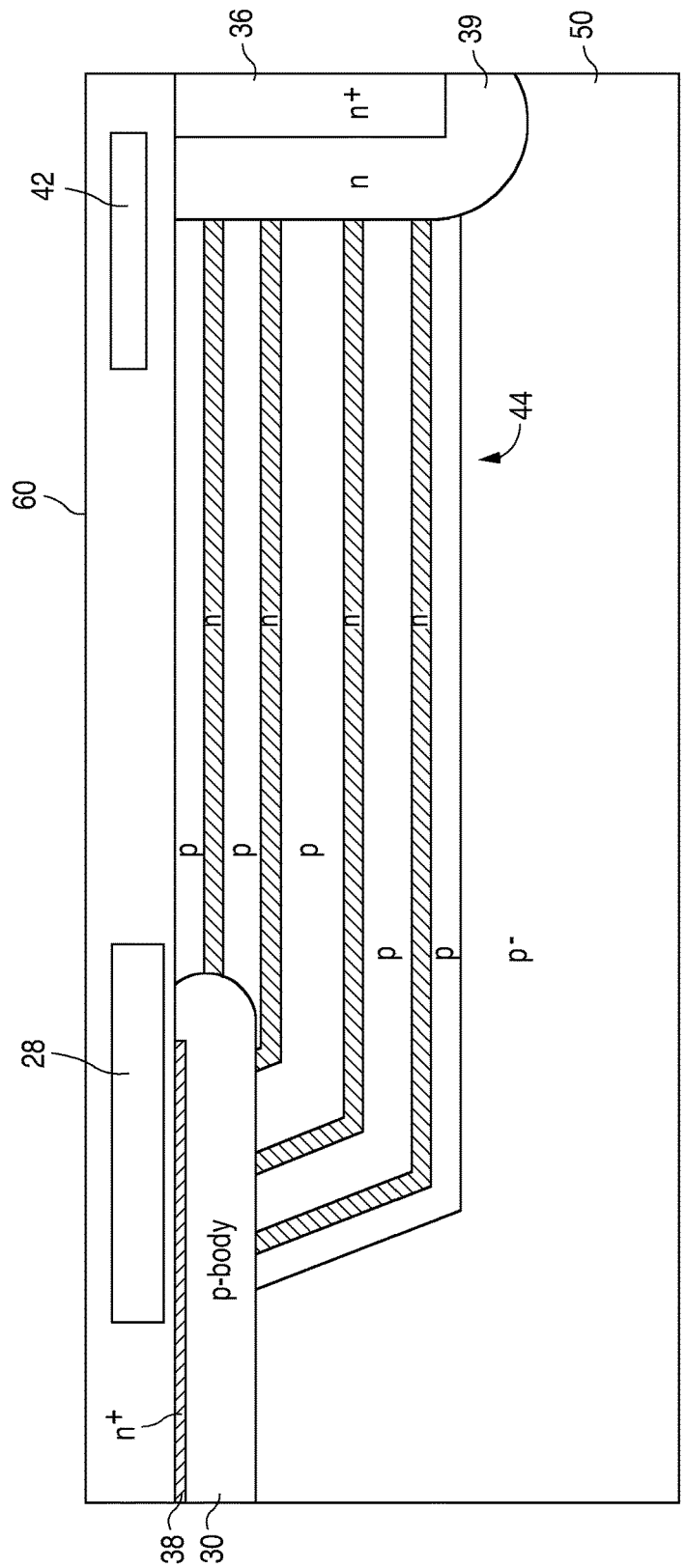

FIG. 14 illustrates a P-body 30 and N+ source 38 formed by implantation and diffusion while using the gate 28 as a mask. Note how the P-body 30 has sufficiently diffused under the gate 28 to contact all the layers of the RESURF structure 44. A P+ body contact 33 (FIG. 16) will be formed later to avoid diffusion under the gate 28.

Figure 15:
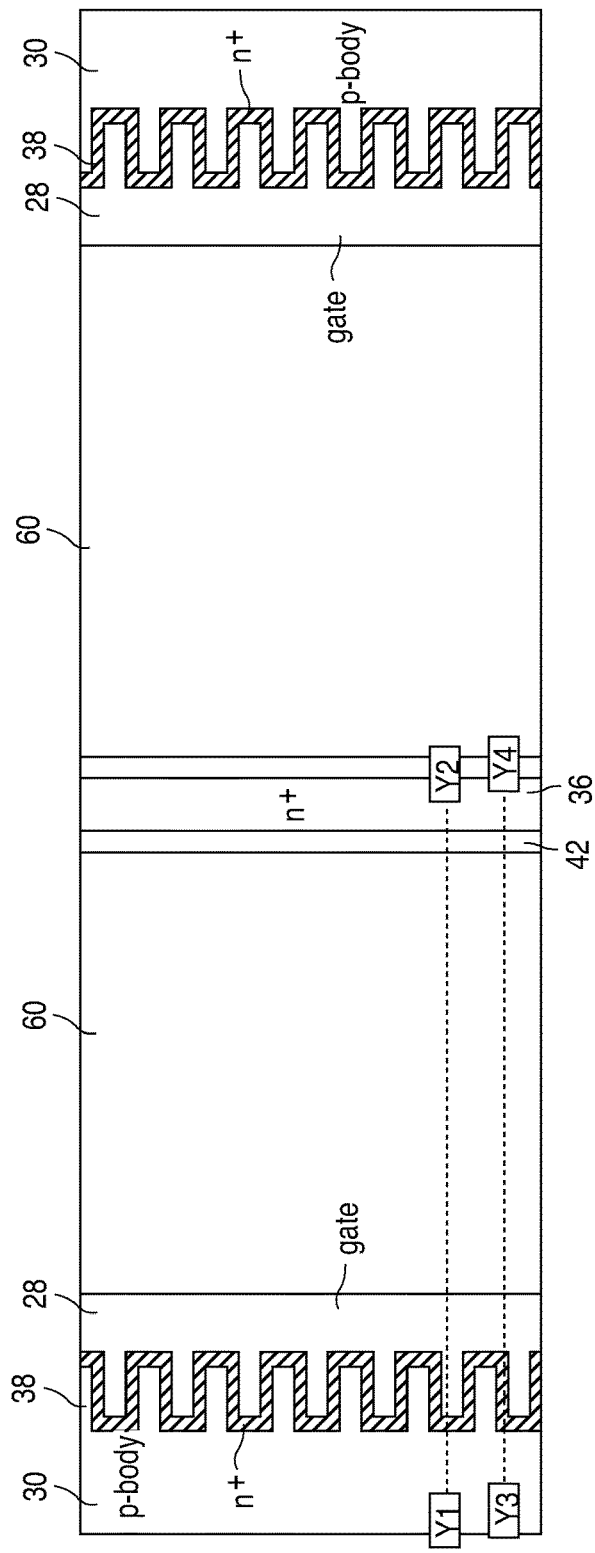

FIG. 15 is a top down view showing a much larger area of the wafer in the X and Y directions. Note that the gate 28 and channel have a corrugated shape to greatly increase the effective width of the gate 28 for increased current handling. In another embodiment, the gate/channel may be straight or form closed shapes such as squares or hexagons.

Figure 16:
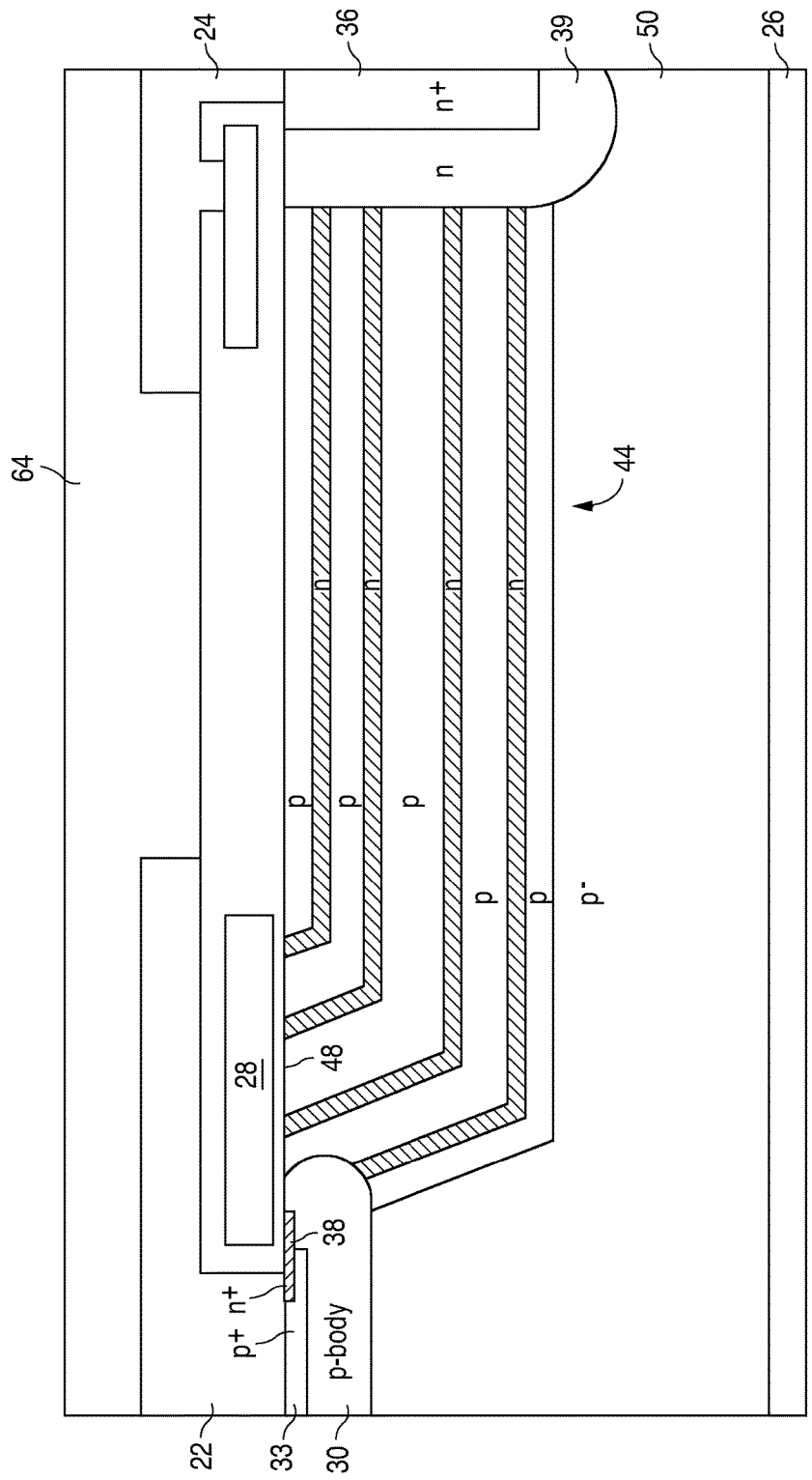

FIG. 16 illustrates the formation of the implanted P+ body contact 33, the source metal 22, the drain metal 24, a backside metal 26 (connected to the source potential), and a passivation layer 64 (e.g., BPSG). FIG. 16 is a cross-section of the MOSFET of FIG. 15 cut across line Y1-Y2 after the metallization. The wafer may be thinned prior to forming the backside metal 26.

Figure 17:
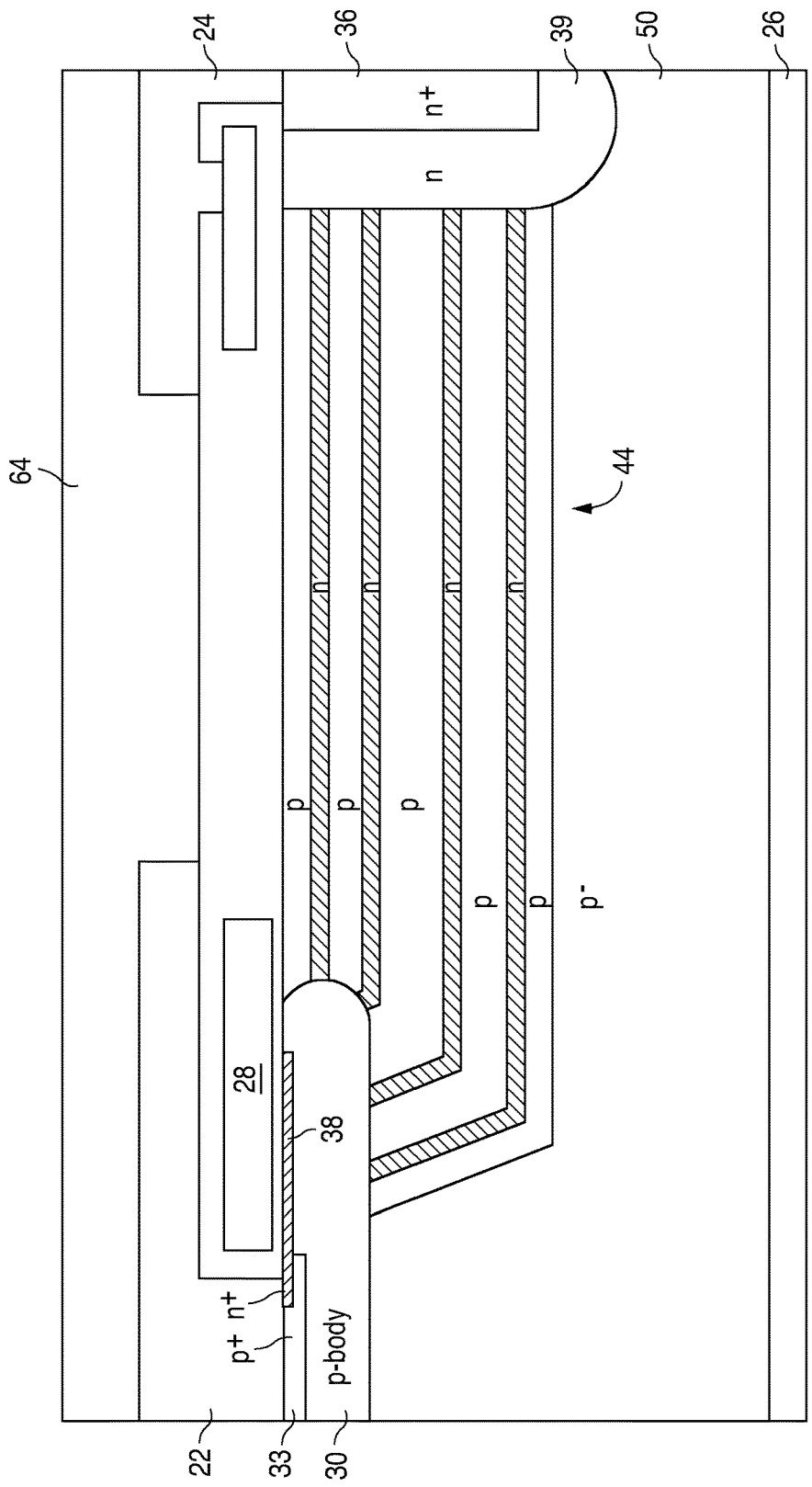

FIG. 17 is a cross-sectional view of the MOSFET of FIG. 15 cut across the line Y3-Y4 after the metallization.

Figure 18:
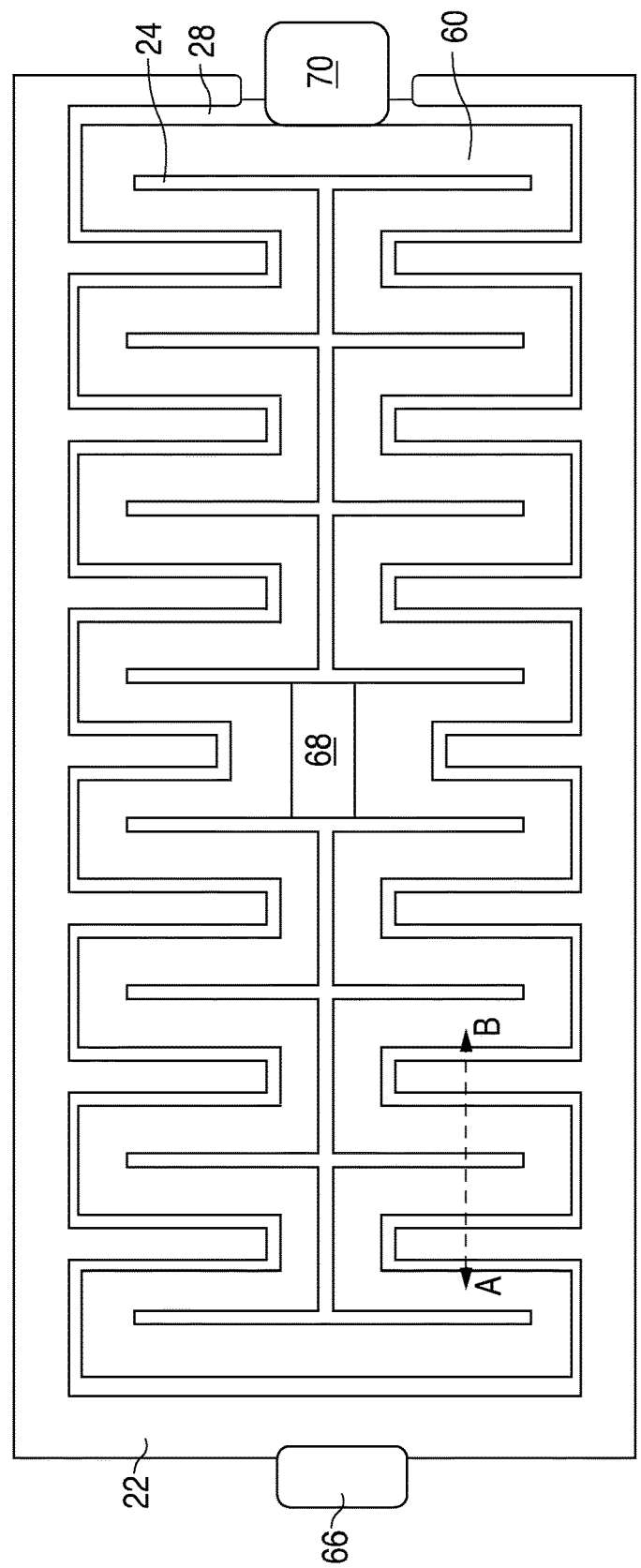

FIG. 18 is a top down view of the lateral MOSFET 20A showing a much larger area, where the corrugated shape of the gate/channel shown in FIG. 15 is too small to see. The N+ drain regions (below the drain metal 24) are interdigitated with the N+ source regions (below the source metal 22) to greatly increase the effective width of the gate/channel for increased current handling and reduced on-time. The RESURF structure is below the oxide 60. The source metal 22 terminates in a large source pad 66 for wire bonding, the drain metal 24 terminates in a large drain pad 68 for wire bonding, and the gate 28 terminates in a large gate pad 70 for wire bonding. Other connection techniques for a packaged integrated circuit may be used.

The width along the line AB in FIG. 18, representing the width shown in FIG. 15, may be any size and in one embodiment is about 240 microns. Any number of cells may form the overall MOSFET depending on the require current. The length of a RESURF structure between the source and drain for a 700 volt MOSFET may be about 55-60 microns.

Figure 19:
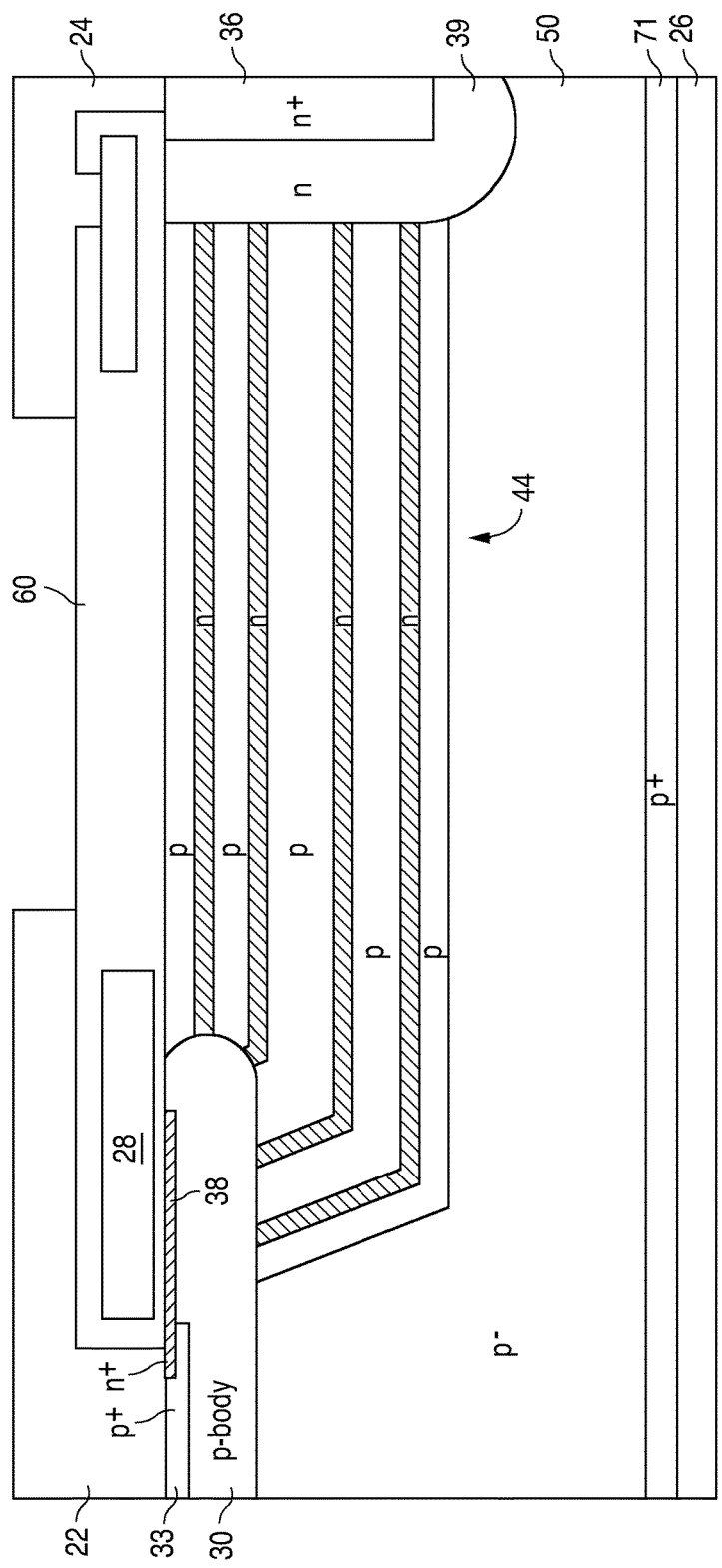
FIG. 19 illustrates another embodiment of the invention, cut along line Y3-Y4 of FIG. 15, with an added P+ clamp diode anode in the bottom surface of the substrate for forming a vertical diode, with respect to the drain, for clamping a reverse voltage applied between the source and drain for a fast recovery (reduced P carrier injection from the backside).

FIG. 19 is similar to FIG. 17 but adds an implanted P+ layer 71 (a clamping diode anode), after wafer thinning, on the backside surface of the substrate 50 to create a vertical diode to clamp voltage to protect the MOSFET from Electrical Over Stress (EOS) in certain applications, such as a reverse voltage spike, and enable faster recovery.

Figure 20:
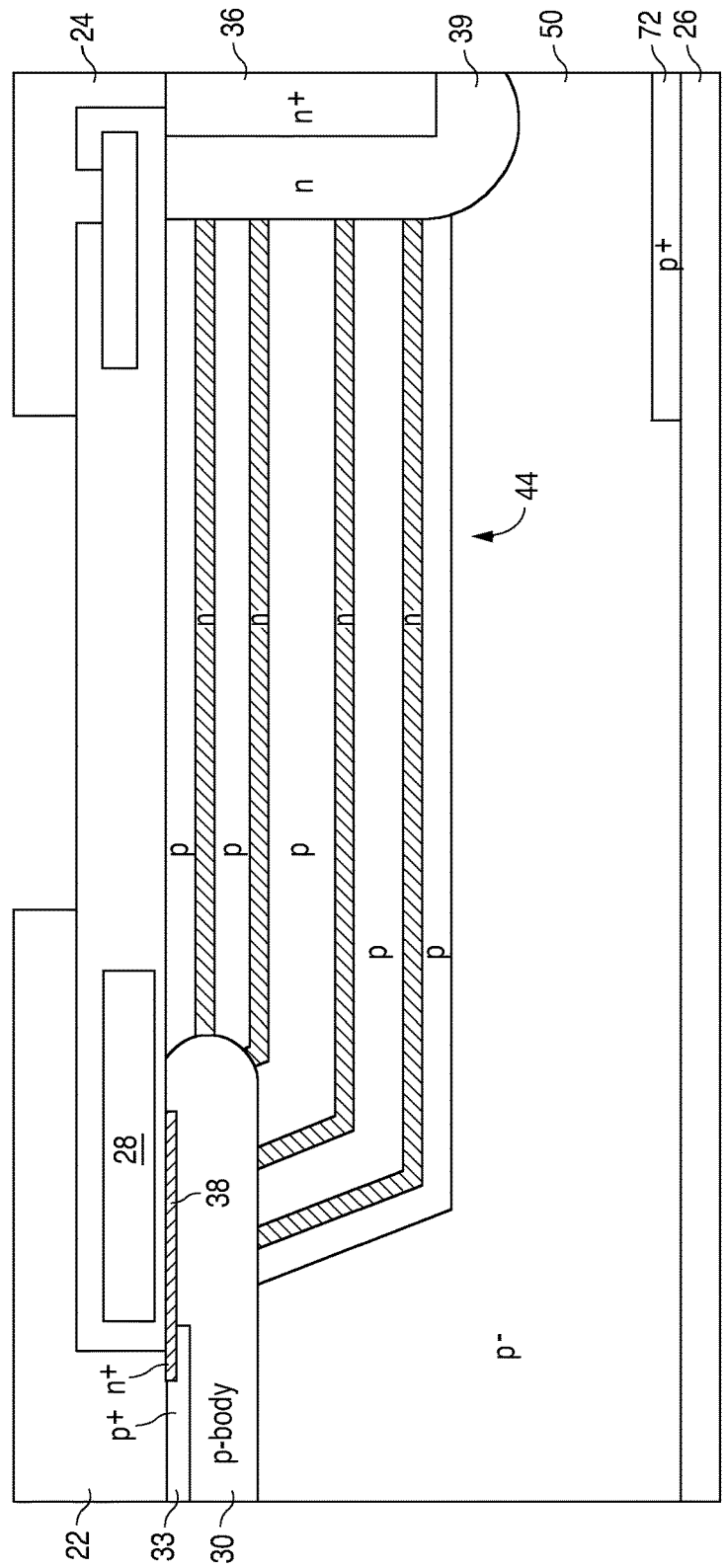
FIG. 20 illustrates another embodiment, similar to FIG. 19 but with the vertical clamping diode only being formed below the drain.

As shown in FIG. 20, if faster recovery is desired, the clamping diode anode can be a small backside P+ region 72 that is closer to the N+ drain 36 to limit injection.

Figure 21:
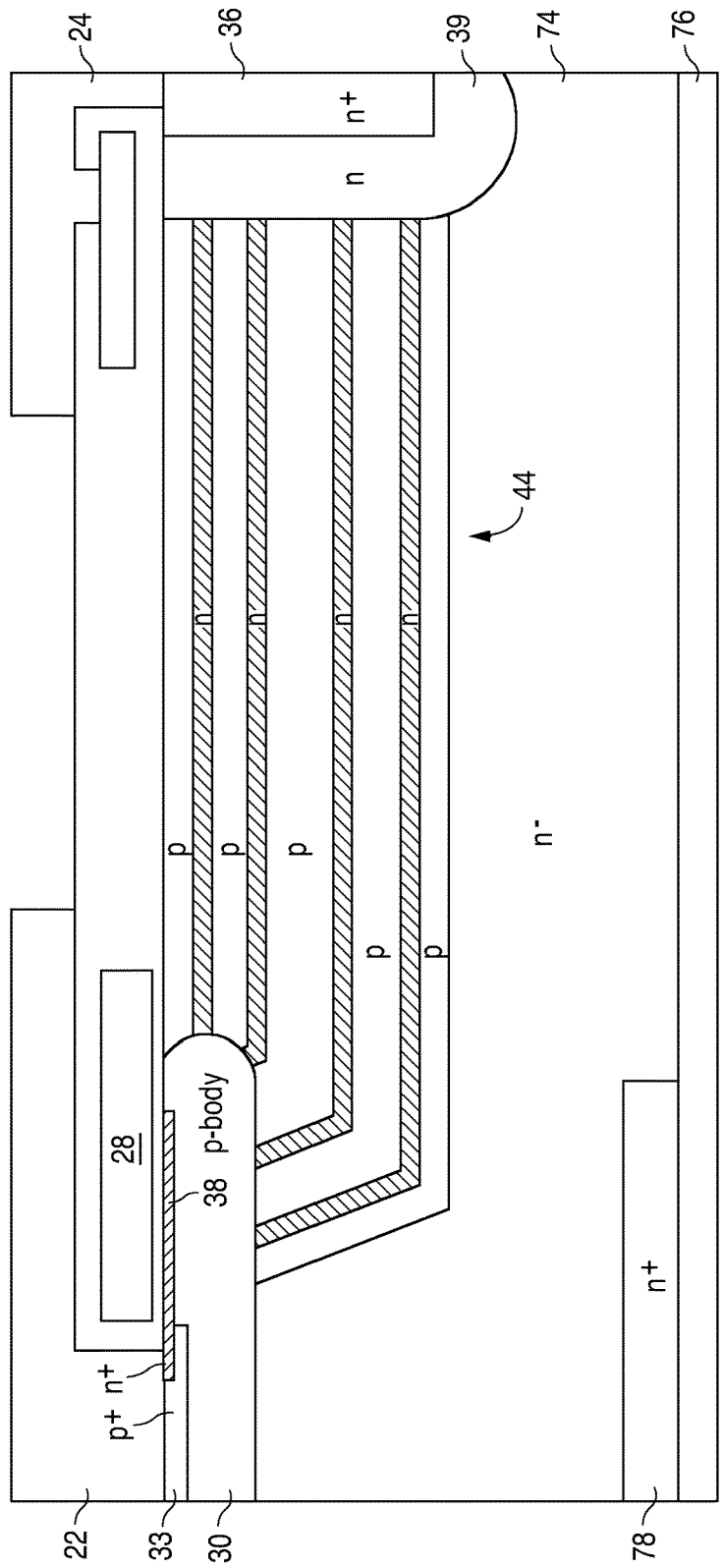
FIG. 21 illustrates a lateral MOSFET similar to the previous embodiments but where the MOSFET uses an N-type substrate, where the backside metal is coupled to the drain potential, and where and an added N+ clamp diode cathode is formed in the bottom surface of the substrate below the source for forming a vertical diode, with respect to the source, for clamping a reverse voltage applied between the source and drain for a fast recovery (reduced N carrier injection from the backside).

FIG. 21 shows a MOSFET constructed using an N-substrate 74 having a backside metal 76 coupled to the drain potential. A vertical clamping diode is formed by implanting an N+ region 78 in the backside surface below the source area.

Figure 22:
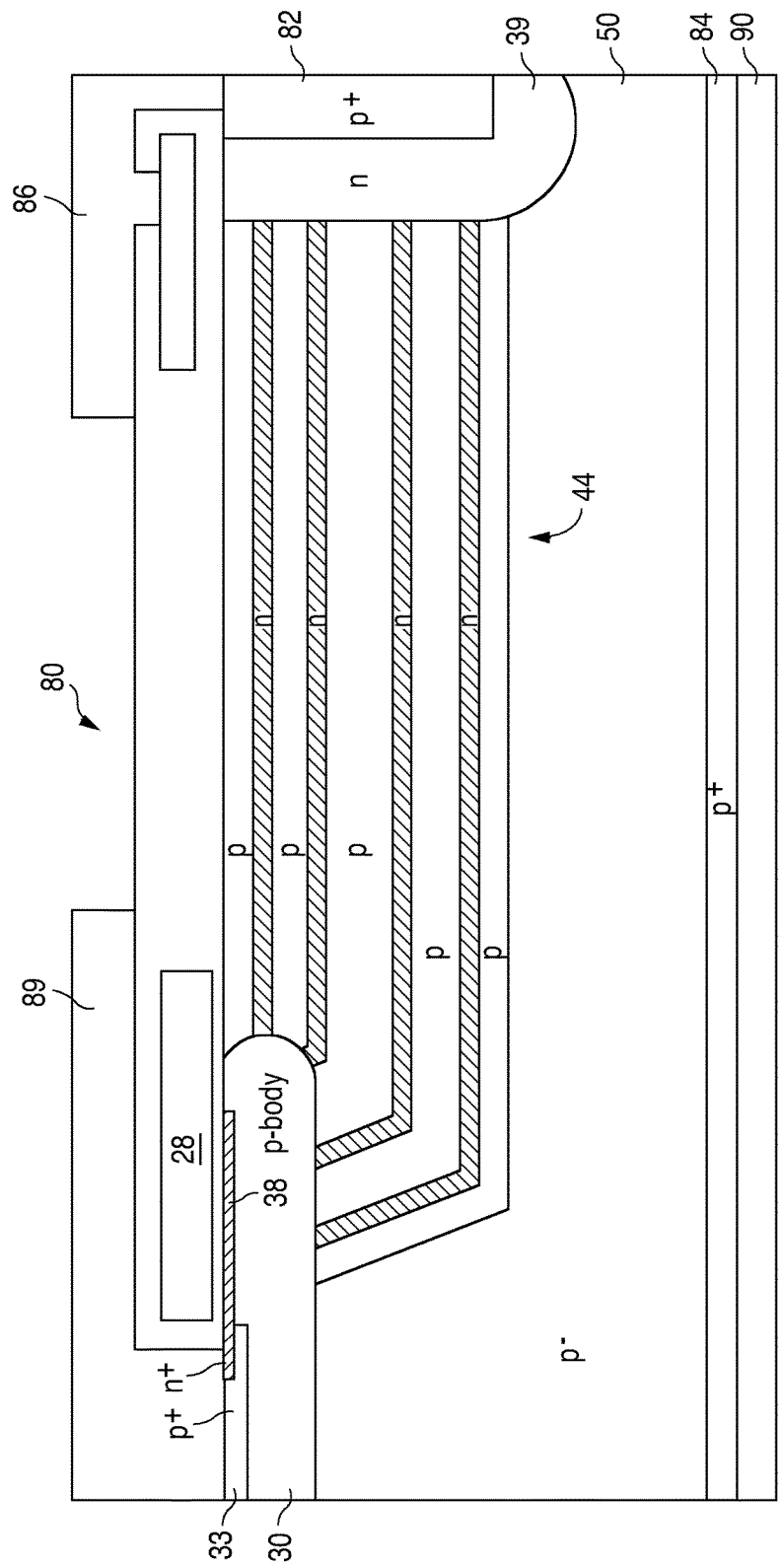
FIG. 22 illustrates a lateral Insulated Gate Bipolar Transistor (IGBT) having a structure similar to the above-described structures but where the drain is replaced with a P-type region to form a collector of a PNP transistor when the device is turned on, where the backside metal is connected to the emitter potential, and where a P+ clamp diode anode is formed at the bottom of the P-type substrate for forming a vertical clamping diode for fast recovery.

FIG. 22 illustrates an Insulated Gate Bipolar Transistor (IGBT) 80 generally formed using the same techniques as those used to form the lateral MOSFET but with a P+ collector 82 (doped poly-Si) instead of an N+ drain. A P+ layer 84 in the backside surface causes a vertical PNP transistor to be formed for clamping. A collector metal 86 and emitter metal 89 are shown. The backside metal 90 is coupled to the emitter potential. Once current flow is initiated by the MOSFET portion turning on, the current flow forward biases the emitter/base of the IGBT to turn on the lateral PNP bipolar transistor, which reduces on-resistance and voltage drop.

Figure 23:
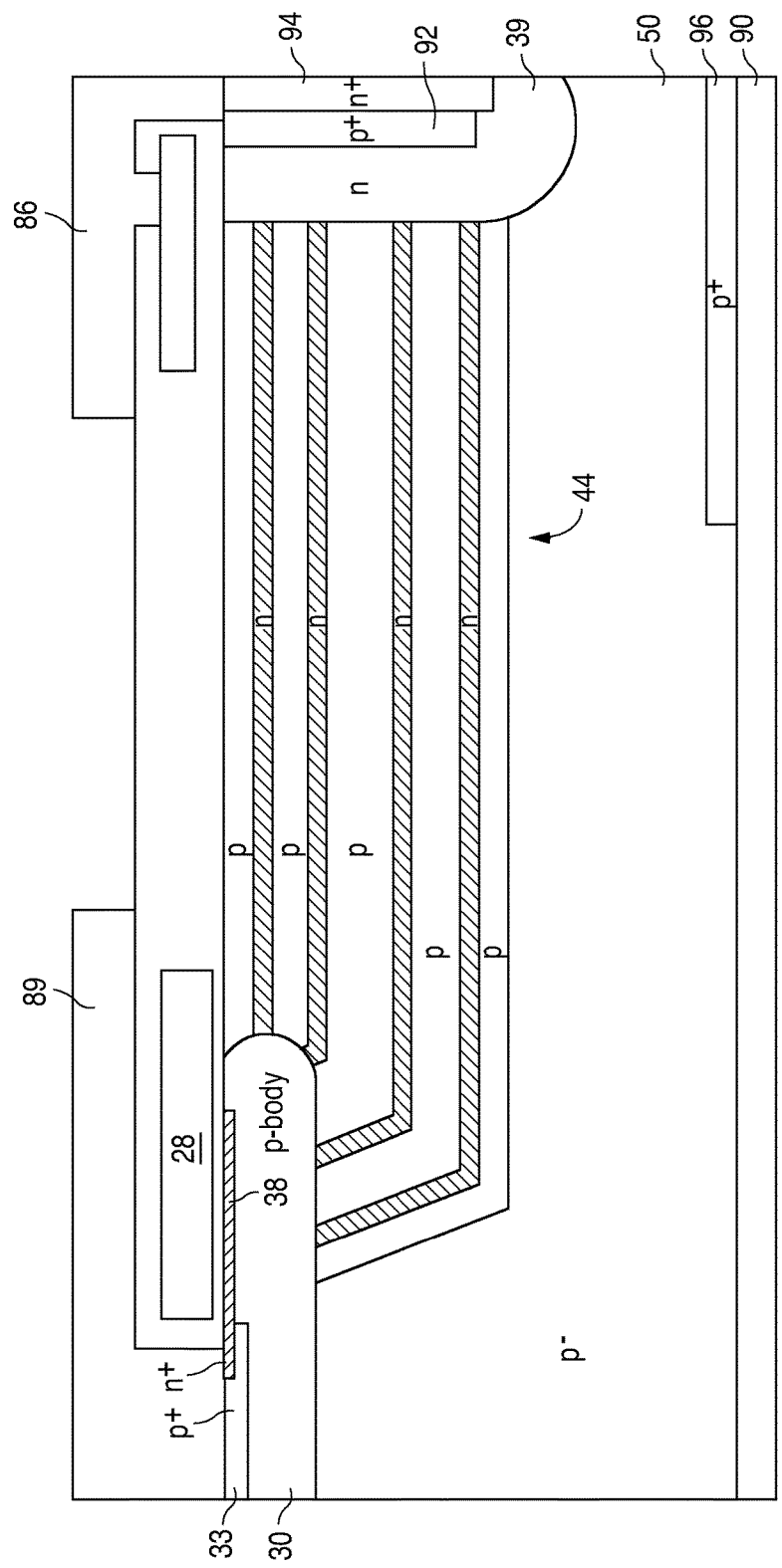
FIG. 23 is similar to the IGBT of FIG. 22 but where a P+ type clamp diode anode is only formed under the collector.

FIG. 23 is similar to FIG. 22 but is a reverse conducting IGBT having a "collector" (for conducting in one direction) formed with a P+ region 92 and an "emitter" (for conducting in the reverse direction) formed with an N+ region 94. A P+ region 96 provides a vertical clamping diode (a forward recovery diode) or a vertical clamping PNP transistor.

Figure 24:
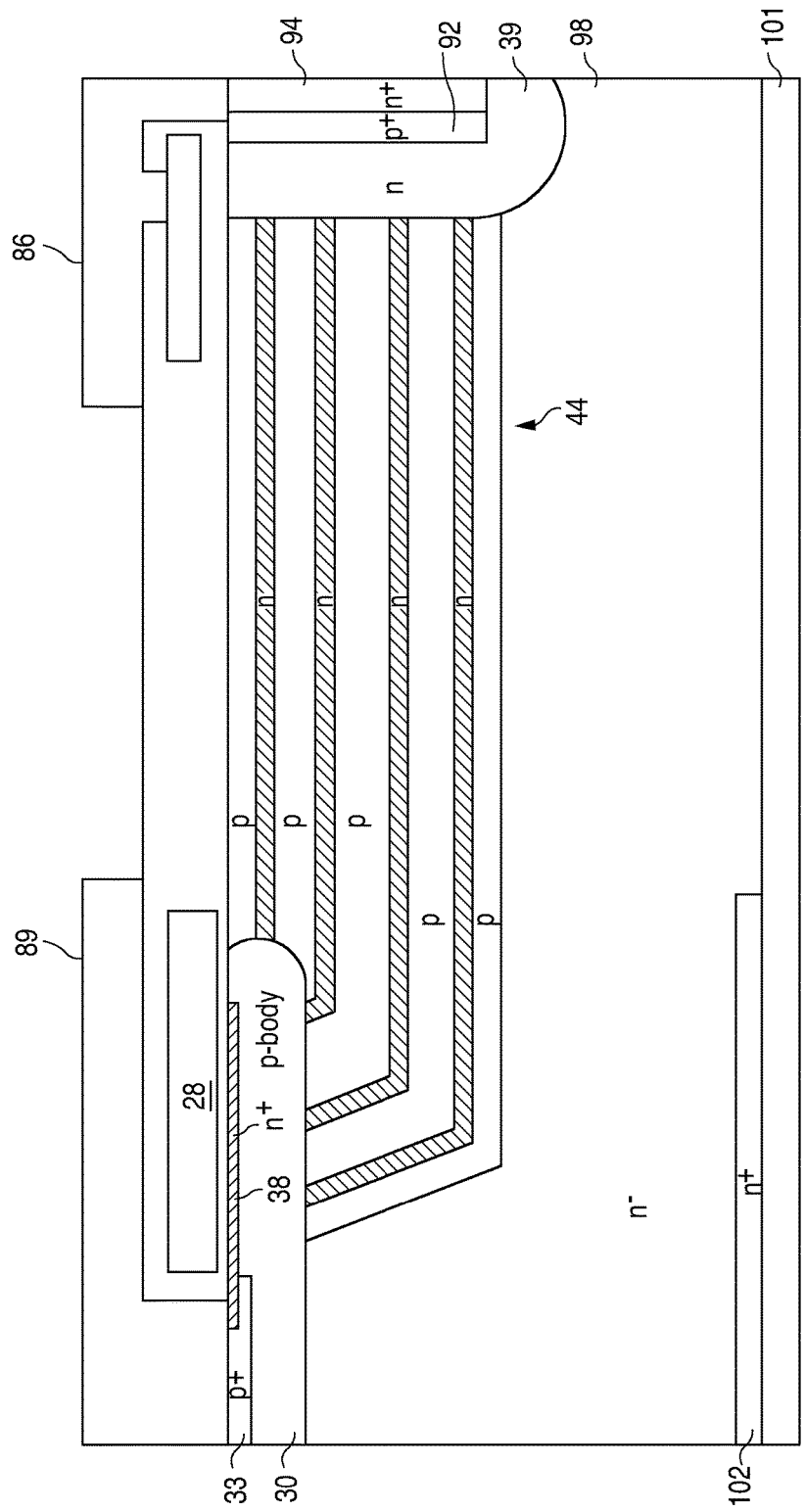
FIG. 24 illustrates an IGBT where the substrate is an N-type, where the backside metal is coupled to the collector potential, and where an N+ clamp diode cathode is formed in the bottom of the N-type substrate under the emitter for forming a vertical clamping diode for fast recovery.

FIG. 24 illustrates another reverse conducting IGBT with an N-substrate 98. The backside metal 101 is coupled to the collector potential. An N+ cathode region 102 forms a vertical clamping diode.

Figure 25:
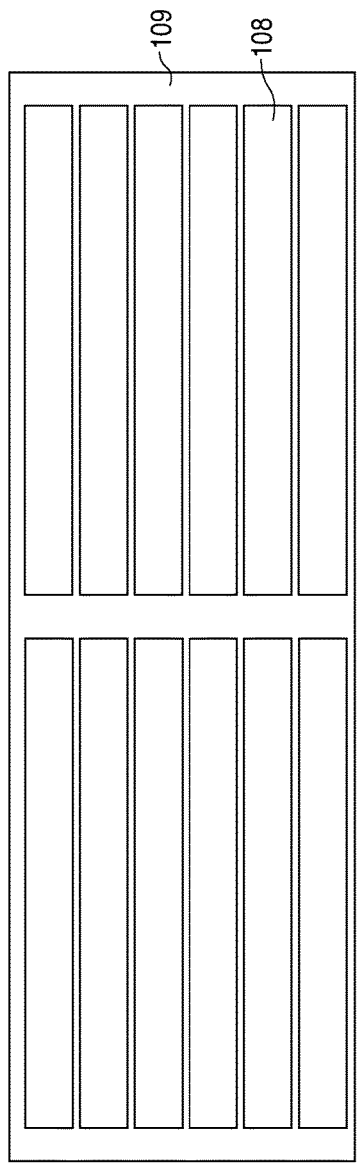
FIG. 25 is a top down view illustrating where areas of a substrate are etched to form the trenches for a RESURF structure for multiple rectangular cells, in accordance with another embodiment of the invention. All four sides of each trench have angled walls, with the bottom surface being horizontal.
Figure 26:
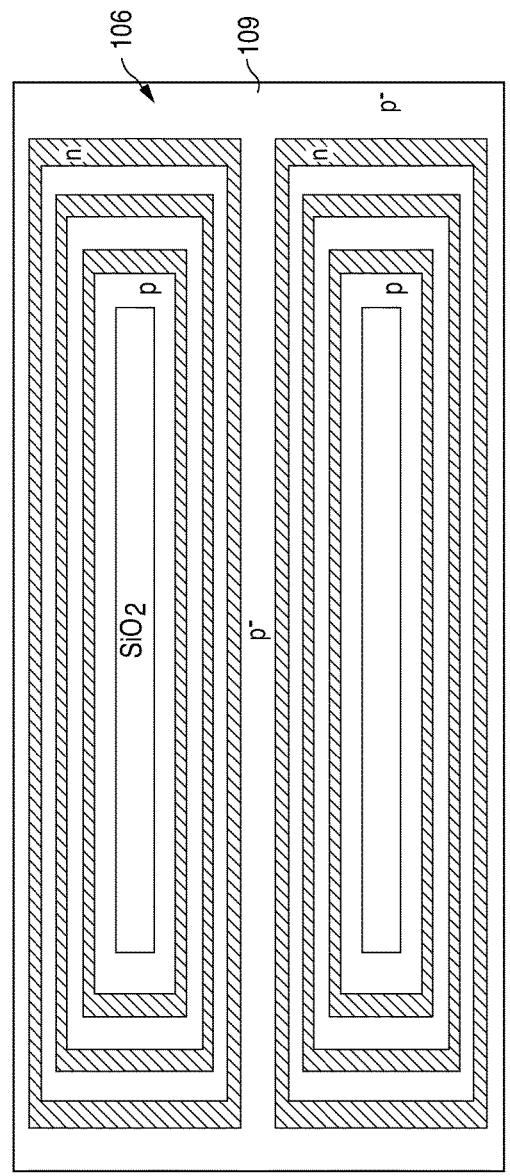
FIG. 26 illustrates the RESURF layers formed in the trenches of FIG. 25, where the RESURF layers are similar to those described above. The other regions of the MOSFET are formed in a manner similar to that described above to form an array of cells connected in parallel.
Figure 27:
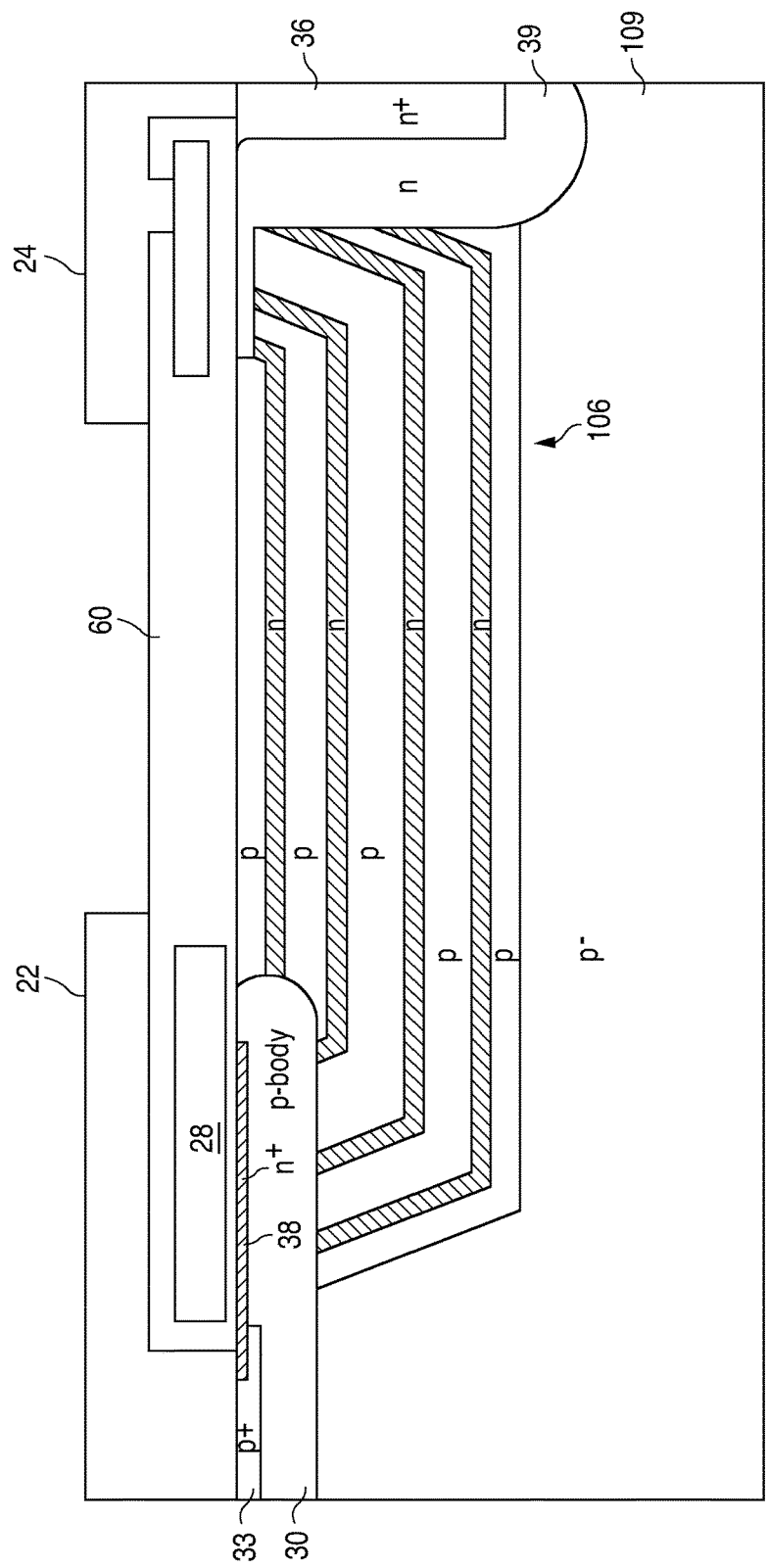
FIG. 27 illustrates a lateral MOSFET where the RESURF layers angle upward to the top surface on both the source side and the drain side.

FIGS. 25-27 illustrate a lateral MOSFET configuration that is slightly different from those described above. In this design, the P and N-layers in the RESURF structure 106 (FIG. 27) are angled upwards to both the source and drain, as shown in FIG. 27. Both the source and drain are on mesas. The N buffer layer 39 can be extended at the surface to facilitate current flow from N-RESURF layers to the drain contact.

FIG. 25 is a top down view of a portion of a wafer showing areas 108 that are etched in a silicon substrate 109 to form trenches for the RESURF structure 106, where the trenches have a horizontal middle portion and upward tilted end portions and side portions.

FIG. 26 illustrates just two of the RESURF structures 106 after the P and N-layers have been formed in the trenches and etched using CMP, as previously described. The substrate 109 is P-type.

FIGS. 28-35 illustrate different embodiments of a lateral MOSFET using non-gate trenches to effectively elongate the length of the RESURF structure without requiring additional top surface area of the substrate. Embodiments with trenched gates and planar gates are shown. The RESURF structure terminates at the source end by being angled upwards in the same manner as described above. The focus of FIGS. 28-35 is on the vertically corrugated RESURF structure due to the non-gate trenches.

Figure 28:
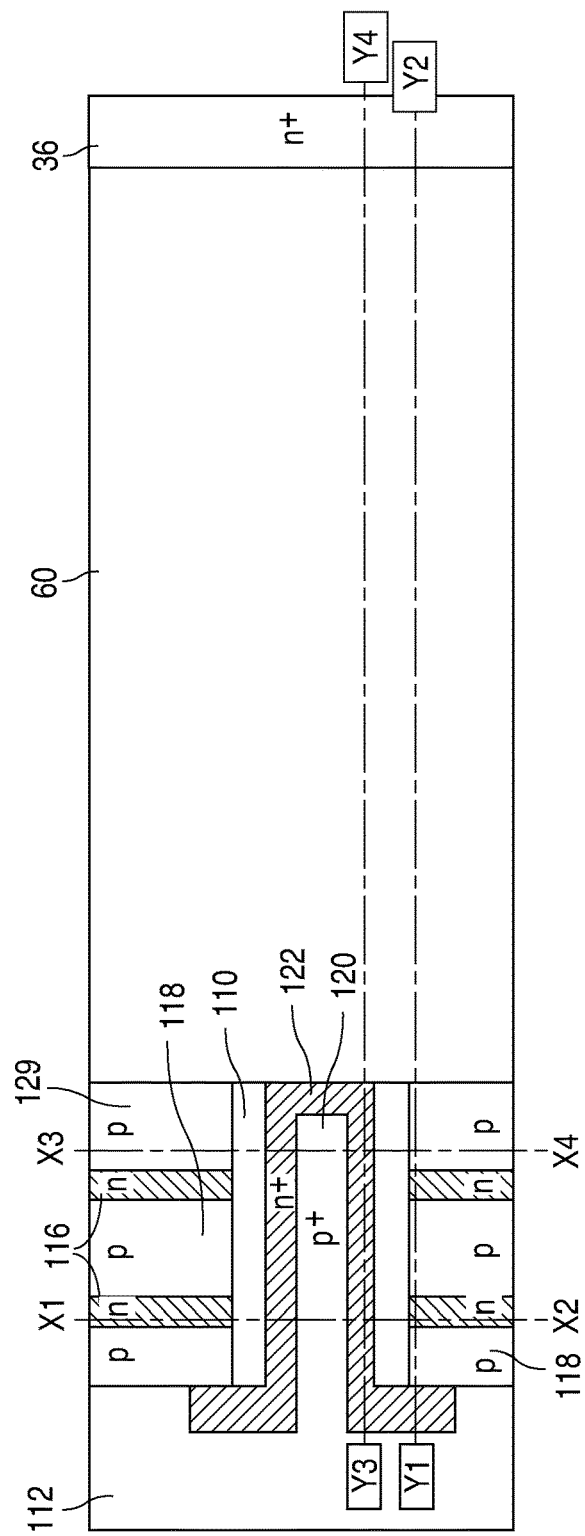

FIG. 28 is a top down view of one lateral MOSFET cell which may use a trenched gate or a lateral gate.

For a trenched gate embodiment, FIG. 29 illustrates the structure of FIG. 28 cut along line X1-X2 of FIG. 28. FIG. 29 illustrates the MOSFET cut across two of the trenched gates 110. The gates 110 are insulated from the P-body 112 by gate oxide 114. The cross-section cuts across only one N-type layer 116 and one P-type layer 118 of a RESURF structure that has been angled upward to the surface, as previously described. A P+ body contact 120 and N+ source 122 are connected to the source metal 124. Oxide 126 insulates the source metal 124 from the gates 110. The substrate 128 is P-type. A backside metal layer 130 is coupled to the source potential.

FIG. 30 illustrates the structure of FIG. 28 cut along line X3-X4 of FIG. 28, which cuts through a P-type layer 129 as one of the RESURF layers.

Figure 31:
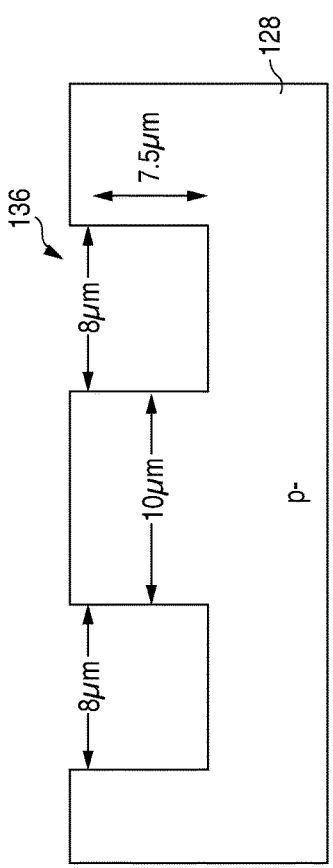
FIGS. 31-35 illustrate the formation of a lateral MOSFET with a vertically corrugated RESURF structure for an effectively long length of the RESURF structure to either increase the breakdown voltage for a given size MOSFET or reduce the size of the MOSFET for a given breakdown voltage.
Figure 32:
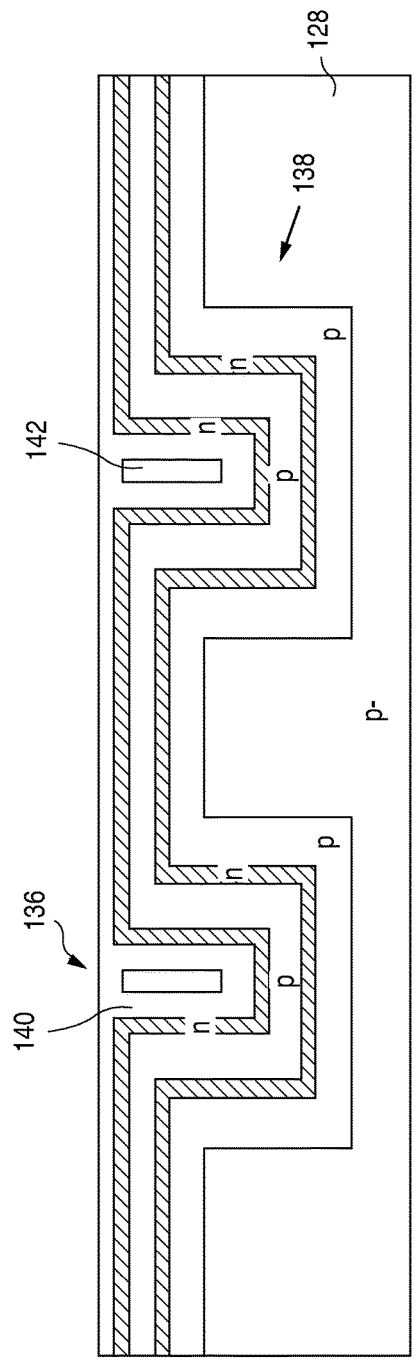

FIGS. 31-32 show the formation of the vertically corrugated RESURF structure between the source and drain. FIG. 31 shows the starting substrate 128 with trenches 136 formed by RIE, where the trenches 136 are for forming a RESURF structure between a source and a drain. Examples of dimensions are shown.

FIG. 32 illustrates the epitaxial growth and/or implant of P and N-layers in the trenches 136 (along the sidewalls and bottom surfaces of the trenches) and over the substrate surface to form a vertically corrugated RESURF structure 138. FIG. 32 also illustrates how the trenches 136 are filled with an oxide 140. One or more floating poly-Si fillers 142 may be formed in the oxide 140, if the trenches are large, to prevent cracking.

Figure 33:
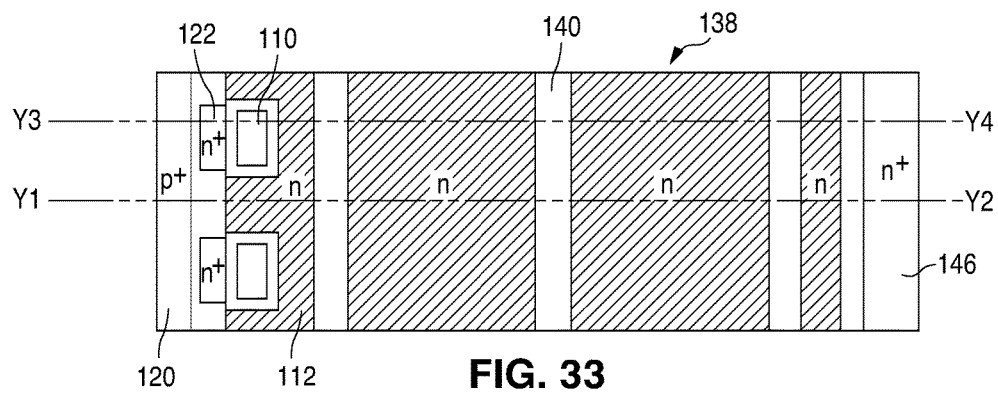

FIG. 33 is a top down view of a wider area showing how the RESURF structure 138 extends between an N+ source 122 and an N+ drain 146. The trenches (filled with oxide 140) greatly increase the effective length of the corrugated RESURF structure 138 without using additional top surface area.

Figure 34:
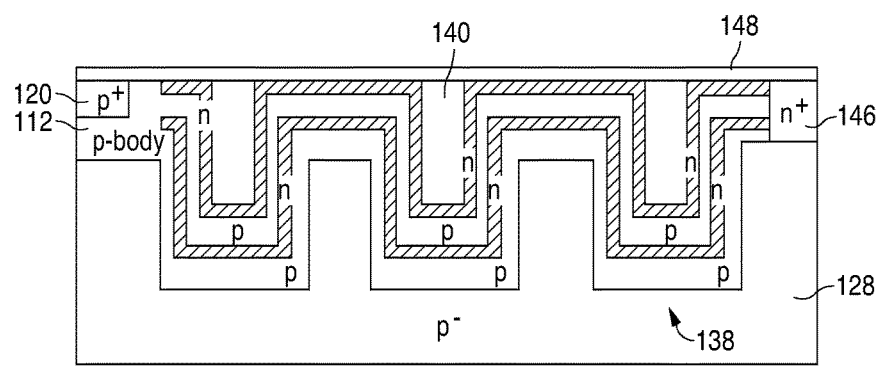
Figure 35:
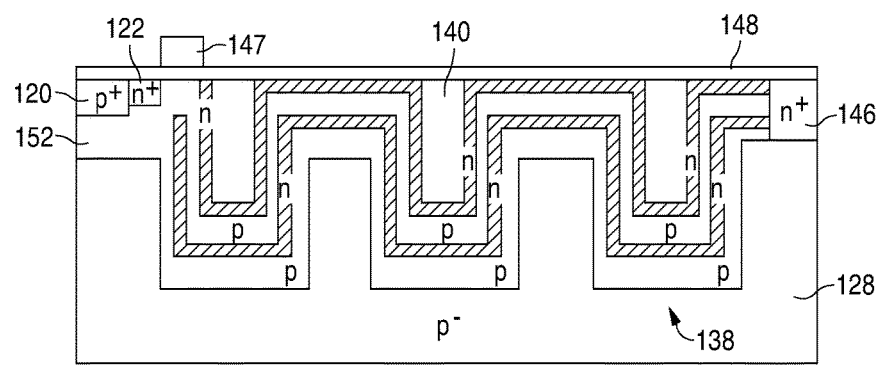

The gates 110 may be the trenched gates of FIGS. 29 and 30 or may be the lateral gate 147 of FIG. 35. FIG. 34 illustrates the MOSFET cut across the line Y1-Y2 in FIG. 33, showing an oxide layer 148 overlying the RESURF structure 138.

Assuming that the gates are lateral gates over the surface, FIG. 35 illustrates the MOSFET cut across the line Y3-Y4 in FIG. 33, showing the source 122 and a lateral gate 147 over a channel region of a P-body 152. When the gate 147 is coupled to a voltage above the threshold voltage, a current is conducted between the source 122 and drain 146 via the RESURF structure 138.

Accordingly, the vertically corrugated RESURF structure 138 has been shown for use with a trenched gate and a lateral gate.

Corrugation of the RESURF structure 138 (as opposed to a straight RESURF structure) can reduce the top surface area of the RESURF structure by as much as 50% for the same breakdown voltage and on-resistance. This approach would be preferred for low and medium current HV lateral MOSFET type devices to reduce chip area.

By further growing the P and N-layers of the RESURF structure 138 along the sidewalls of the trench (the sides perpendicular to the sides shown in FIG. 35) the width of the RESURF structure 138 is also increased, increasing the current handling capability and reducing the on-resistance.

The various polarities shown can be reversed to form a lateral P-channel MOSFET.

Other embodiments include integrating the various previous embodiments into CMOS and Bipolar-CMOS-DMOS (BCD MOS) Power IC process technology While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A lateral insulated gate transistor formed in a semiconductor substrate comprising:
    a first region of a first conductivity type;
    a second region of the first conductivity type;
    a body region of a second conductivity type;
    a lateral gate insulated from and overlying at least a portion of the body region, wherein the portion of the body region forms a channel, the lateral gate being separated from the channel by a first gate dielectric thickness;
    a third region of the first conductivity type under the lateral gate and abutting the body region, the third region having a dopant concentration less than a dopant concentration of the first region, the third region having a depth that is less than a lateral dimension of the third region extending from the body region and under the lateral gate toward the second region;

a Reduced Surface Field (RESURF) structure comprising alternating layers of a first material of the first conductivity type and a second material of the second conductivity type, the alternating layers of the first material and the second material overlying each other, the alternating layers in a first portion of the RESURF structure running parallel to a top surface of the semiconductor substrate toward the second region, and the alternating layers in a second portion of the RESURF structure inclining upward toward the lateral gate such that ends of the alternating layers in the second portion of the RESURF structure face the lateral gate, wherein the ends of the alternating layers of the first material of the first conductivity type in the second portion of the RESURF structure terminate at a bottom of the third region, wherein the bottom of the third region is above a bottom of the body region, wherein the lateral gate overlies the third region from between the body region to where the alternating layers of the first material and the second material terminate in the third region, and wherein the lateral gate is separated from the third region, from between the body region to where the alternating layers of the first material and the second material terminate in the third region, by the first gate dielectric thickness;

wherein the lateral insulated gate transistor is configured such that, upon a threshold voltage being applied to the lateral gate, a conductive channel is formed in the body region by inversion of the body region under the lateral gate, such that a current flows between the first region and the second region through the third region and RESURF structure, wherein the third region is configured such that, when the conduction channel is formed, current flows laterally through the third region, then through the RESURF structure.

2. The lateral insulated gate transistor of claim 1 wherein the doping concentration of the third region, abutting the body region, is selected to at least partially offset a charge imbalance caused by the body region and to be depleted when the lateral insulated gate transistor is in its off state.

3. The lateral insulated gate transistor of claim 1 wherein the alternating layers of the first material and the second material terminate in the third region of the first conductivity type under the lateral gate, and also terminate in a fourth region of the second conductivity under the lateral gate.

4. The lateral insulated gate transistor of claim 1 wherein the first conductivity type is an N-type, the second conductivity type is a P-type, the first region is a source, and the second region is a drain.

5. The lateral insulated gate transistor of claim 1 wherein there are at least nine alternating layers of the first material and the second material.

6. The lateral insulated gate transistor of claim 1 further comprising a buffer region of the first conductivity type adjacent to the second region, wherein the alternating layers of the first material and the second material terminate at the buffer region.

7. The lateral insulated gate transistor of claim 1 wherein the lateral insulated gate transistor is configured such that, upon the threshold voltage being applied to the lateral gate, the conductive channel is formed in the body region by inversion of the body region under the lateral gate, and one or more of the alternating layers are inverted under the lateral gate, such that the current flows between the first region and the second region through the RESURF structure.

8. The lateral insulated gate transistor of claim 1 wherein the lateral insulated gate transistor comprises a plurality of identical cells electrically connected in parallel, wherein each cell has an identical RESURF structure.

9. The lateral insulated gate transistor of claim 1 further comprising a bottom metal layer electrically coupled to the first region.

10. The lateral insulated gate transistor of claim 9 wherein the semiconductor substrate is a P-type, and the second conductivity type is a P-type, the lateral insulated gate transistor further comprising a P+ type layer forming at least a portion of a bottom semiconductor surface of the lateral insulated gate transistor on which the bottom metal layer is formed for creating a vertical clamp diode anode.

11. The lateral insulated gate transistor of claim 9 wherein the semiconductor substrate is an N-type, and the second conductivity type is a P-type, the lateral insulated gate transistor further comprising an N+ type layer forming at least a portion of a bottom semiconductor surface of the lateral insulated gate transistor on which the bottom metal layer is formed for creating a vertical clamp diode cathode.

12. The lateral insulated gate transistor of claim 1 wherein the lateral insulated gate transistor is a lateral MOSFET.

13. The lateral insulated gate transistor of claim 1 wherein the lateral insulated gate transistor is an Insulated Gate Bipolar Transistor (IGBT), the IGBT further comprising:
a fourth region of the second conductivity type adjacent to the second region, wherein the fourth region is a collector of the IGBT; and
a fifth region formed in the body region being an emitter of the IGBT,
wherein, when the threshold voltage is applied to the lateral gate to create the conductive channel, the current flowing between the first region and the fourth region turns on a lateral bipolar transistor comprising the fourth region, the body region, and the fifth region.

14. The lateral insulated gate transistor of claim 13 further comprising:
a bottom metal layer electrically coupled to the fifth region; and
a sixth region formed in a bottom surface of the semiconductor substrate and contacted by the bottom metal layer for forming a diode.

15. The lateral insulated gate transistor of claim 14 wherein the semiconductor substrate is the second conductivity type, and the sixth region is of the second conductivity type for forming a clamp diode.

16. The lateral insulated gate transistor of claim 14 wherein the semiconductor substrate is the first conductivity type, and the sixth region is of the first conductivity type for forming the diode for conducting a reverse current through the IGBT when forward biased.

17. The lateral insulated gate transistor of claim 1 wherein the RESURF structure forms concentric rings of the alternating layers.

18. The lateral insulated gate transistor of claim 1 wherein the alternating layers of the first material and the second material also incline upward toward a top surface of the lateral insulated gate transistor proximate to the second region.

19. A lateral insulated gate transistor formed in a semiconductor substrate comprising:
a first region of a first conductivity type;
a second region of the first conductivity type;

a body region of a second conductivity type;

a gate insulated from the body region;

a plurality of trenches formed between the gate and the second region, the plurality of trenches running alongside each other and running perpendicular with respect to a direction of current flow between the first region and the second region, each trench in the plurality of trenches having a first sidewall and a second sidewall, the plurality of trenches not containing the gate, the plurality of trenches including a first trench proximate to the first region and a last trench further from the first region and proximate to the second region; and a Reduced Surface Field (RESURF) structure comprising repeating alternating layers of a first material of the first conductivity type and a second material of the second conductivity type, the repeating alternating layers running perpendicular to the first sidewall of each trench in the plurality of trenches and the second sidewall of each trench in the plurality of trenches, the repeating alternating layers being a drift region between the first region and the second region in the lateral insulated gate transistor, wherein the first sidewalls face in a direction of the first region, and the second sidewalls face in a direction of the second region, wherein each of the repeating alternating layers is continuous from the first trench to the last trench, wherein the lateral insulated gate transistor is configured such that, upon a threshold voltage being applied to the gate, a conductive channel is formed in the body region by inversion of the body region proximate to the gate such that a current flows between the first region and the second region through the RESURF structure.

20. The lateral insulated gate transistor of claim 19 wherein the lateral insulated gate transistor is a MOSFET.

* * * * *